United States Patent
Kim et al.

(10) Patent No.: US 11,171,287 B2
(45) Date of Patent: Nov. 9, 2021

(54) VARIABLE RESISTANCE MEMORY DEVICE INCLUDING SILICON CAPPING PATTERN

(71) Applicant: SAMSUNG ELECTRONICS CO., LTD., Suwon-si (KR)

(72) Inventors: Jong-Uk Kim, Yongin-si (KR); Young-Min Ko, Hwaseong-si (KR); Byong-Ju Kim, Hwaseong-si (KR); Kwang-Min Park, Seoul (KR); Jeong-Hee Park, Hwaseong-si (KR); Dong-Sung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/365,874

(22) Filed: Mar. 27, 2019

(65) Prior Publication Data

US 2020/0066981 A1 Feb. 27, 2020

(30) Foreign Application Priority Data

Aug. 22, 2018 (KR) .......................... 10-2018-0097951

(51) Int. Cl.
*H01L 45/00* (2006.01)
*H01L 27/24* (2006.01)

(52) U.S. Cl.
CPC ...... *H01L 45/1233* (2013.01); *H01L 27/2463* (2013.01); *H01L 45/06* (2013.01); *H01L 45/1253* (2013.01); *H01L 45/142* (2013.01); *H01L 45/143* (2013.01); *H01L 45/144* (2013.01); *H01L 45/1608* (2013.01)

(58) Field of Classification Search
None
See application file for complete search history.

(56) References Cited

U.S. PATENT DOCUMENTS

| 9,385,318 | B1 | 7/2016 | Henri |
| 9,502,466 | B1 | 11/2016 | Chuang et al. |
| 9,865,815 | B2 | 1/2018 | Hausmann |
| 2015/0287916 | A1 | 10/2015 | Campbell et al. |
| 2017/0170237 | A1 | 6/2017 | Jung |
| 2017/0170394 | A1 | 6/2017 | Chen et al. |
| 2017/0200768 | A1* | 7/2017 | Park ........................ H01L 45/126 |
| 2018/0047899 | A1* | 2/2018 | Horii ...................... H01L 45/065 |
| 2018/0114903 | A1 | 4/2018 | Hausmann |
| 2019/0036014 | A1* | 1/2019 | Ha .......................... H01L 43/08 |

* cited by examiner

*Primary Examiner* — Daniel Whalen

(74) *Attorney, Agent, or Firm* — F. Chau & Associates, LLC

(57) ABSTRACT

A variable resistance memory device may include a memory unit including a first electrode disposed on a substrate, a variable resistance pattern disposed on the first electrode and a second electrode disposed on the variable resistance pattern, a selection pattern disposed on the memory unit, and a capping structure covering a sidewall of the selection pattern. The capping structure may include a first capping pattern and a second capping pattern sequentially stacked on at least one sidewall of the selection pattern. The first capping pattern may be silicon pattern, and the second capping pattern may include a nitride.

19 Claims, 45 Drawing Sheets

FIG. 2
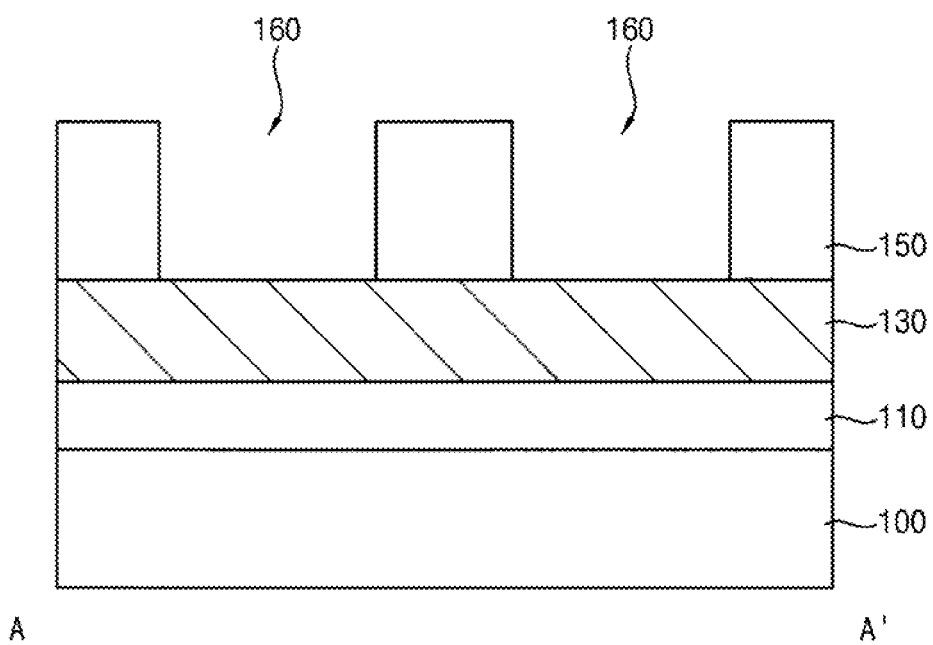
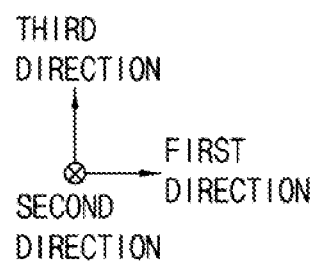

FIG. 4
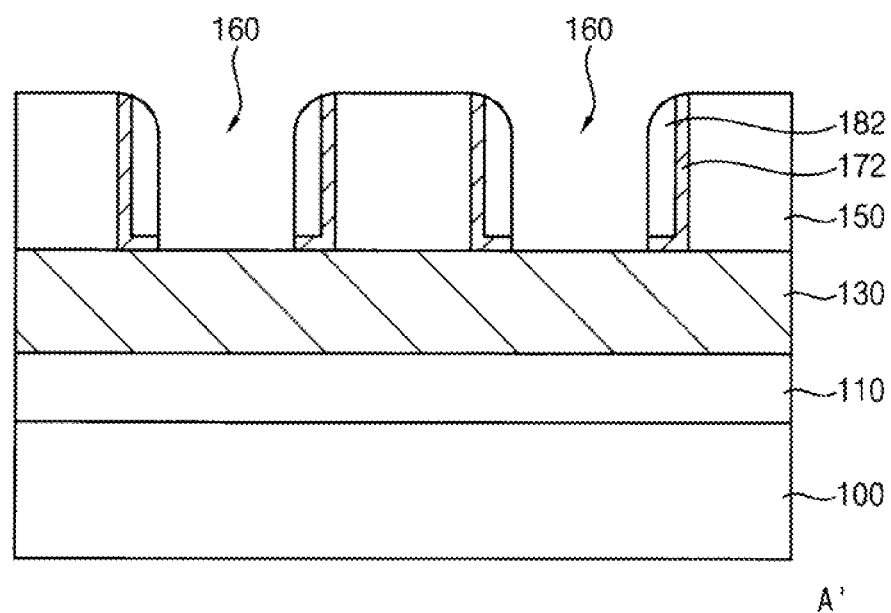
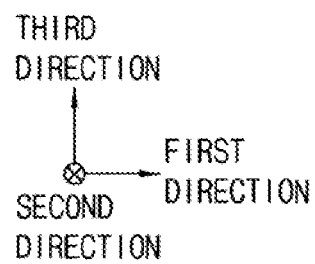

FIG. 6
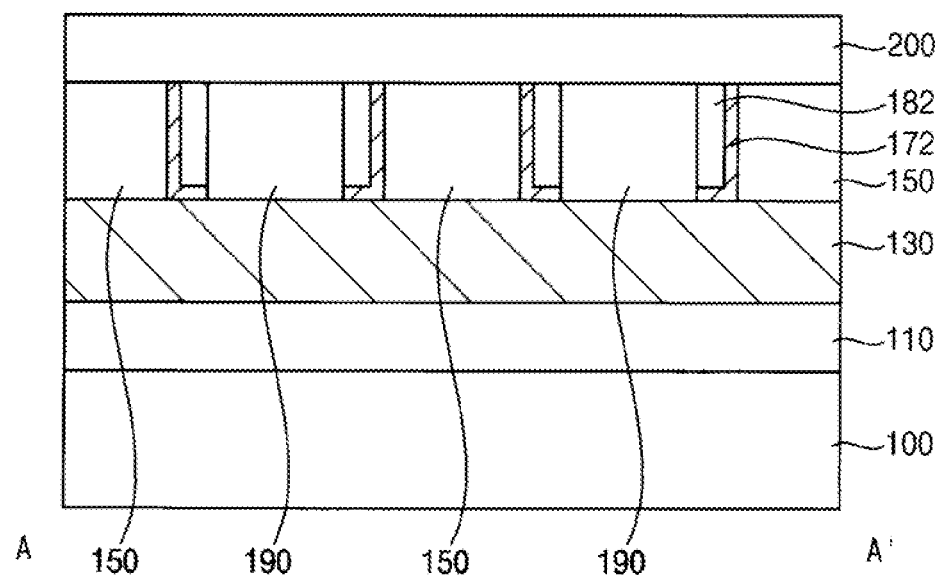
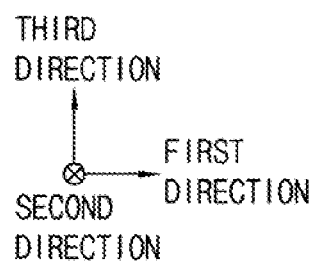

FIG. 7
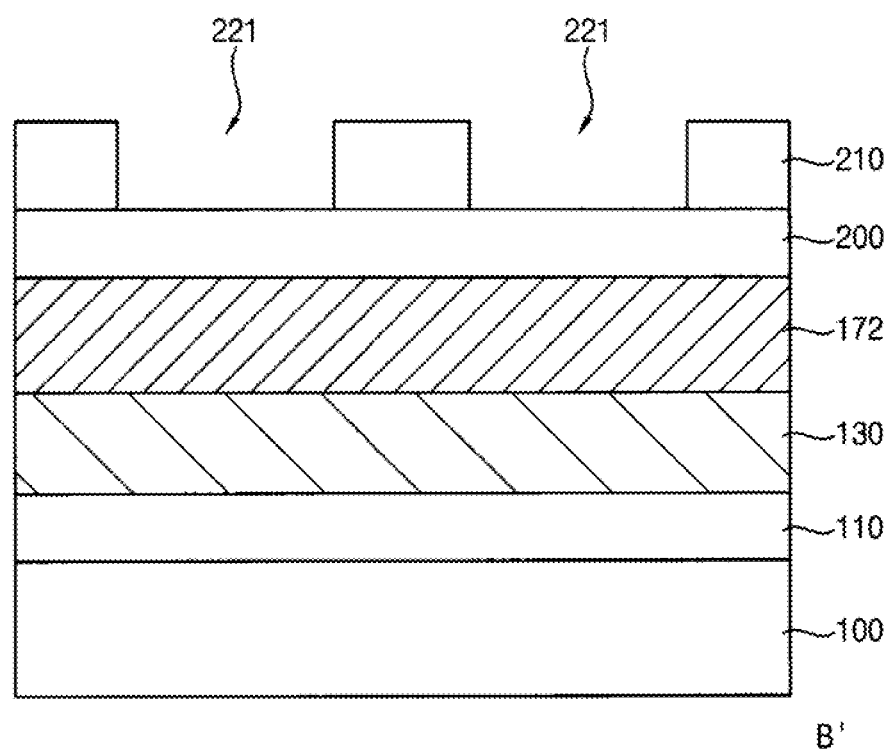
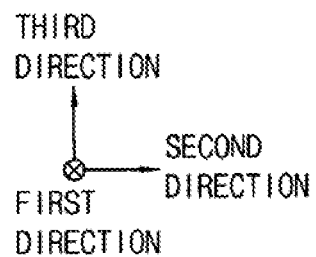

FIG. 14
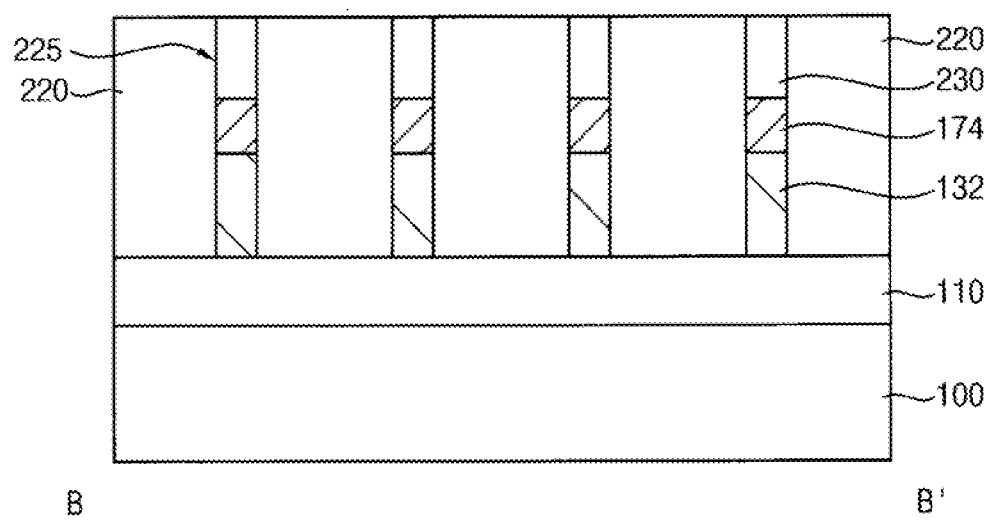
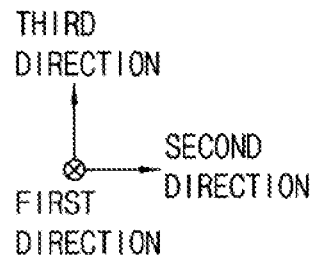

FIG. 16
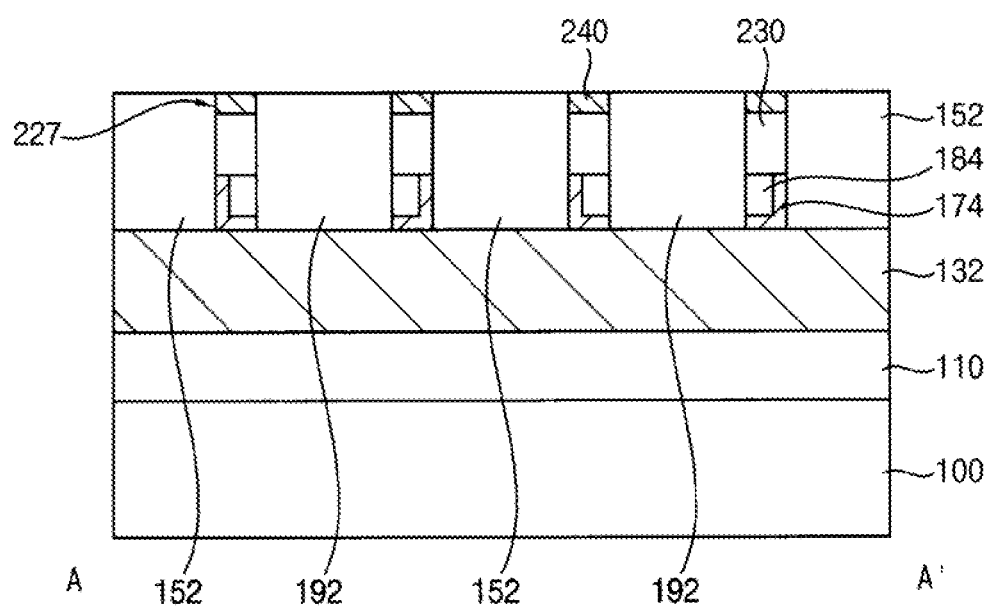
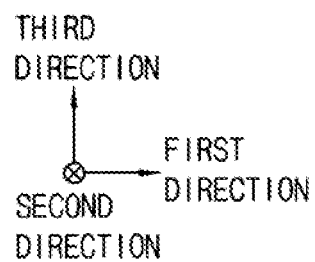

FIG. 20
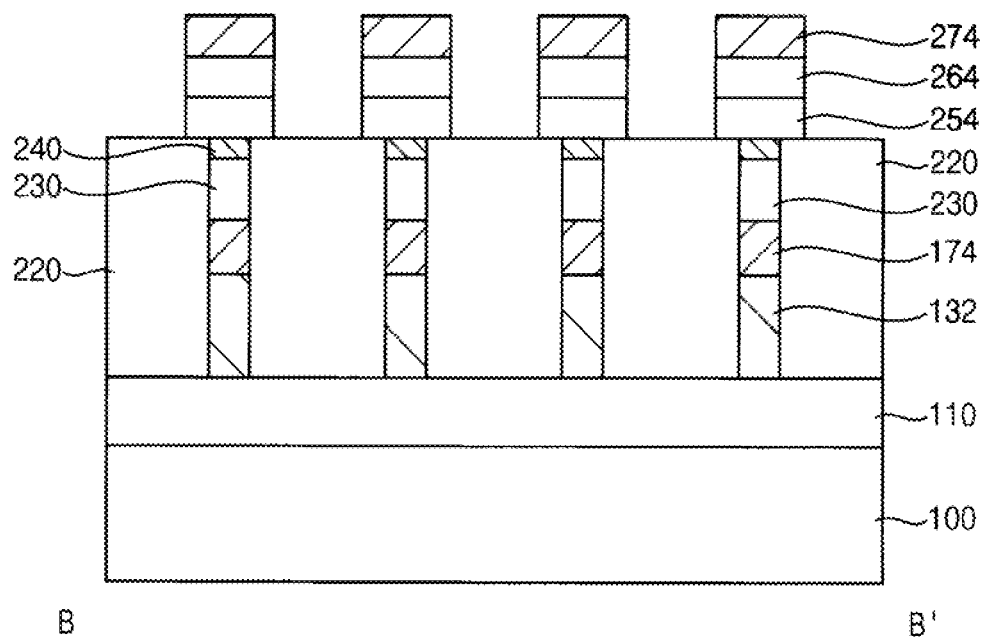
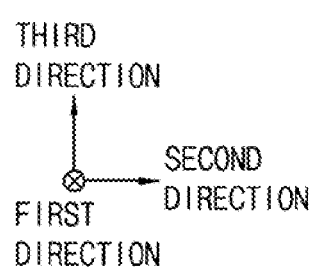

FIG. 24
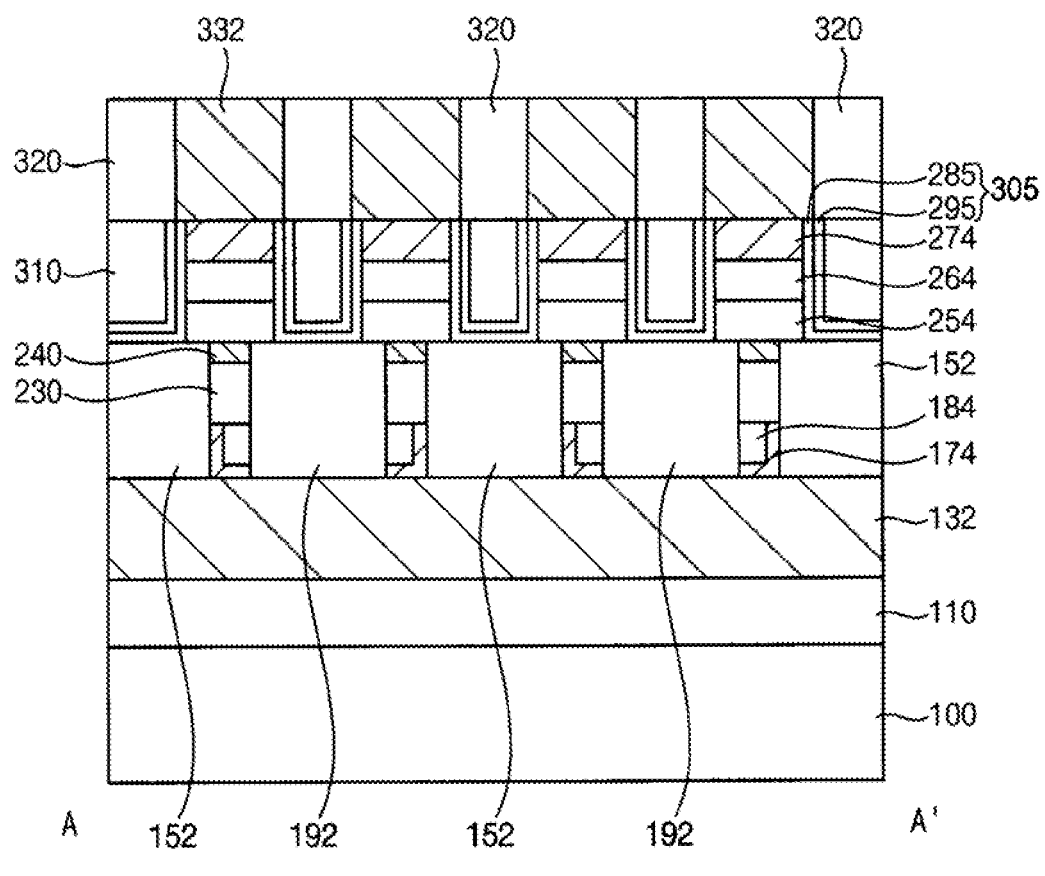
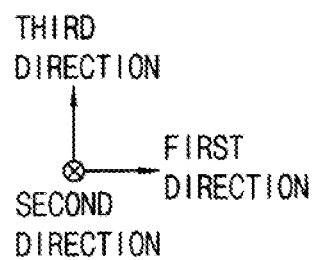

FIG. 25
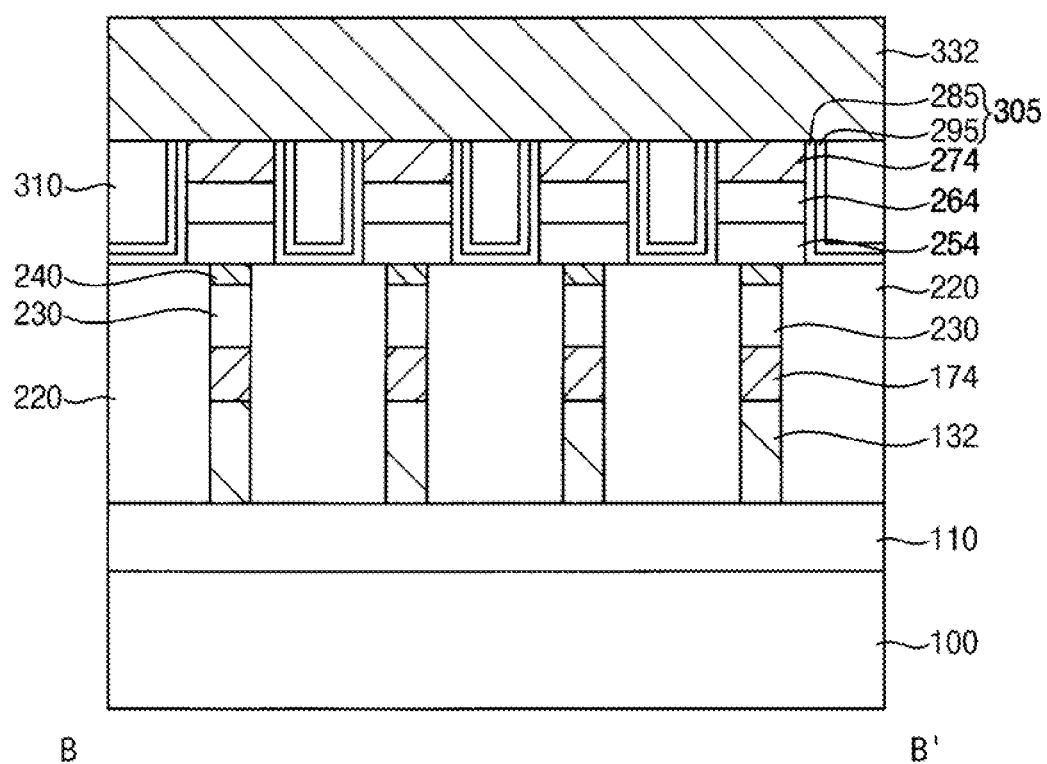
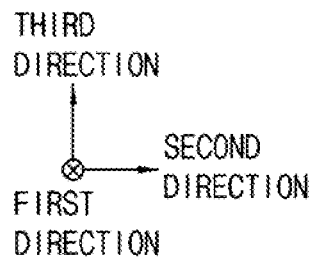

FIG. 30
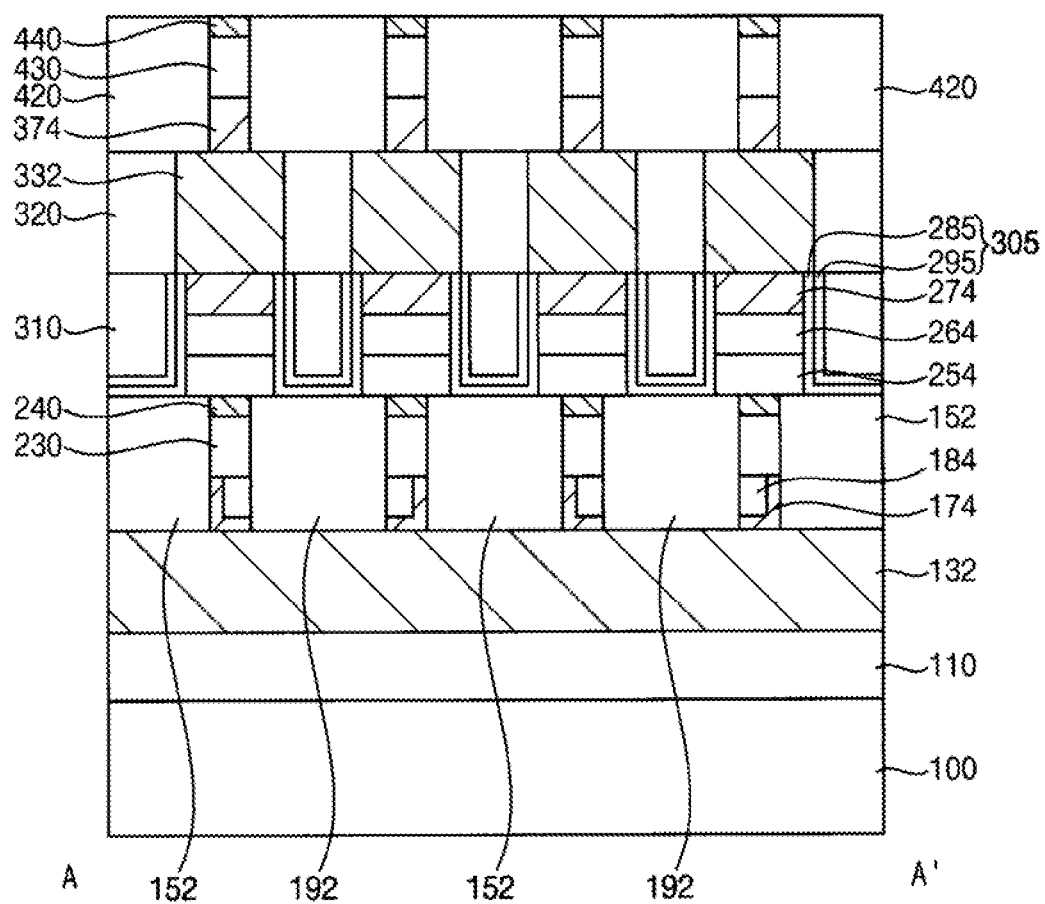
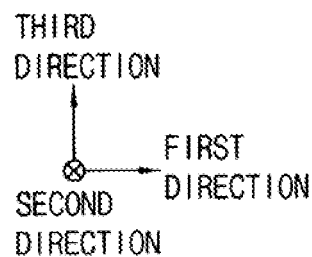

FIG. 31
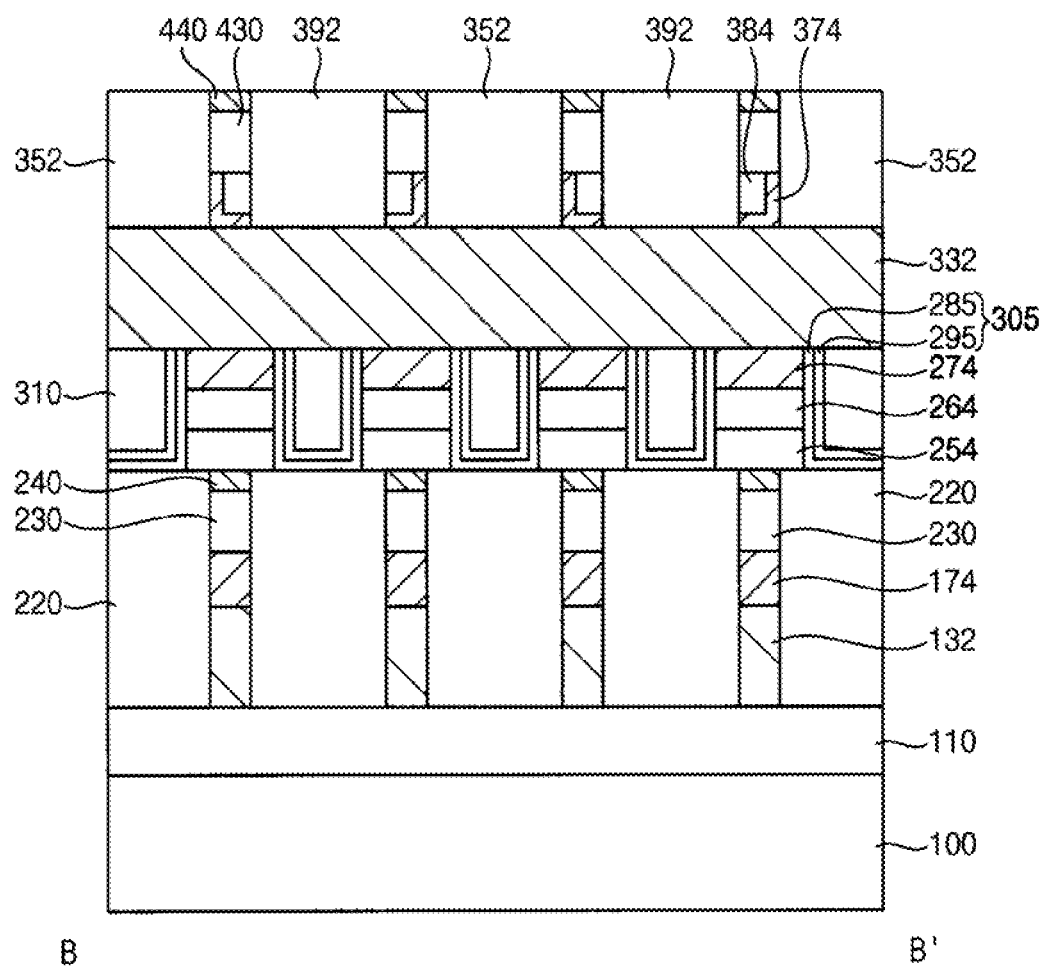
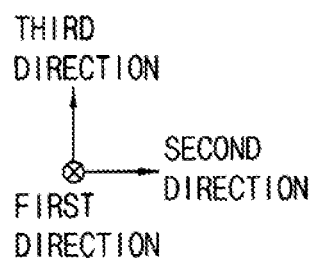

FIG. 33
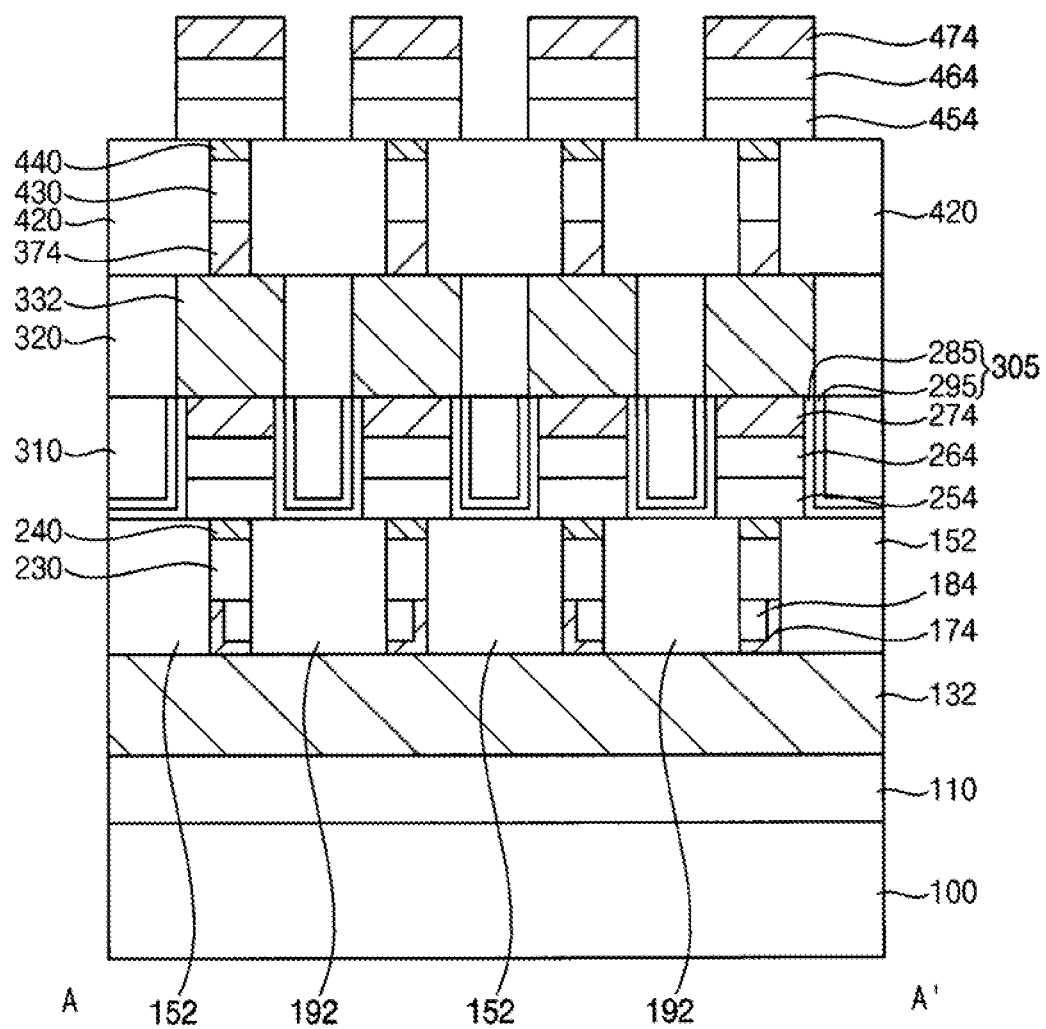
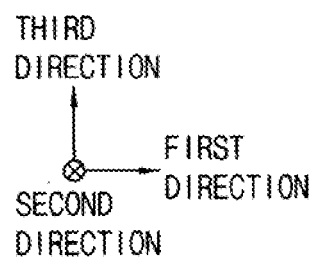

FIG. 35
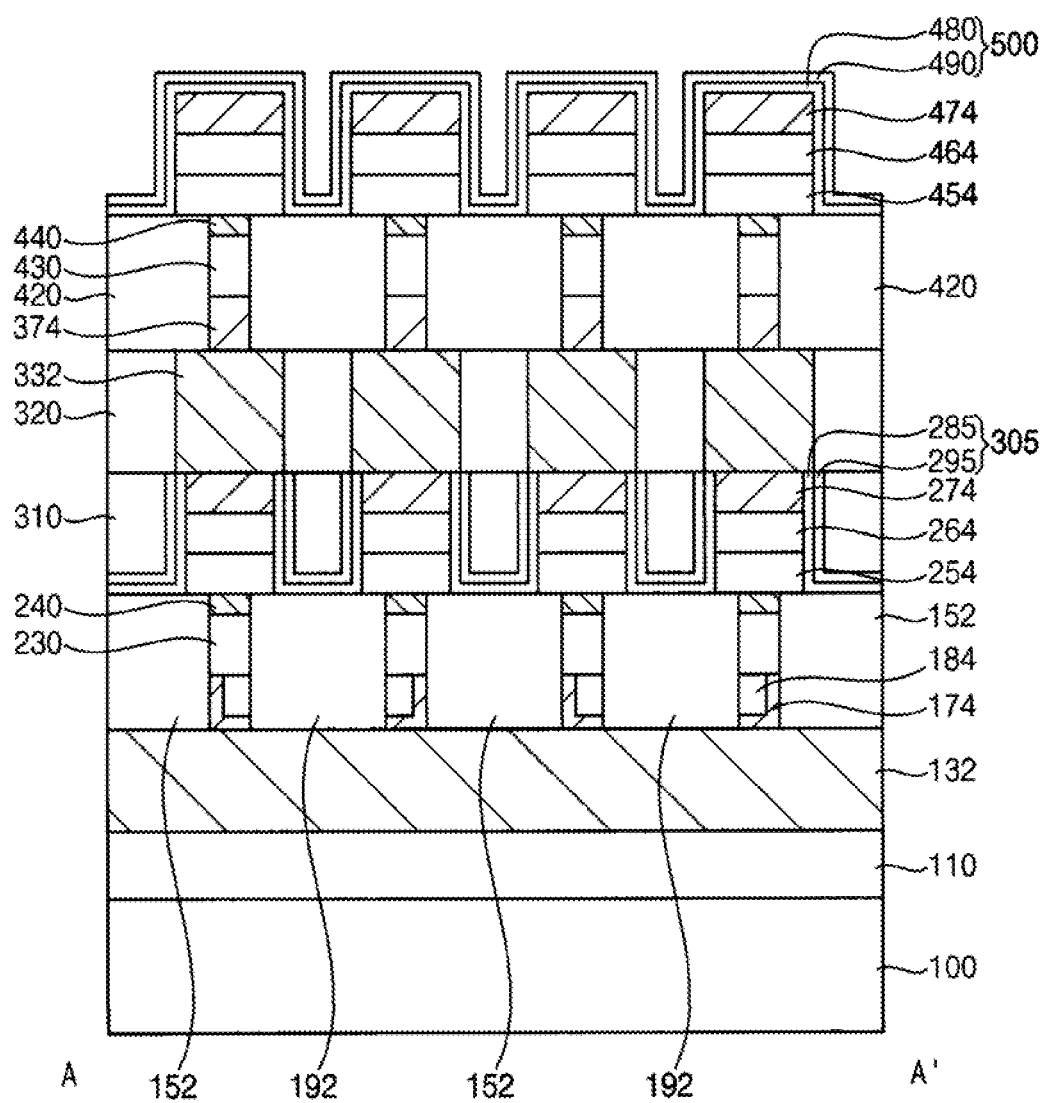
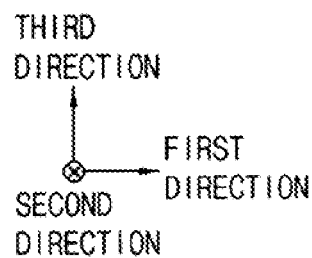

FIG. 38
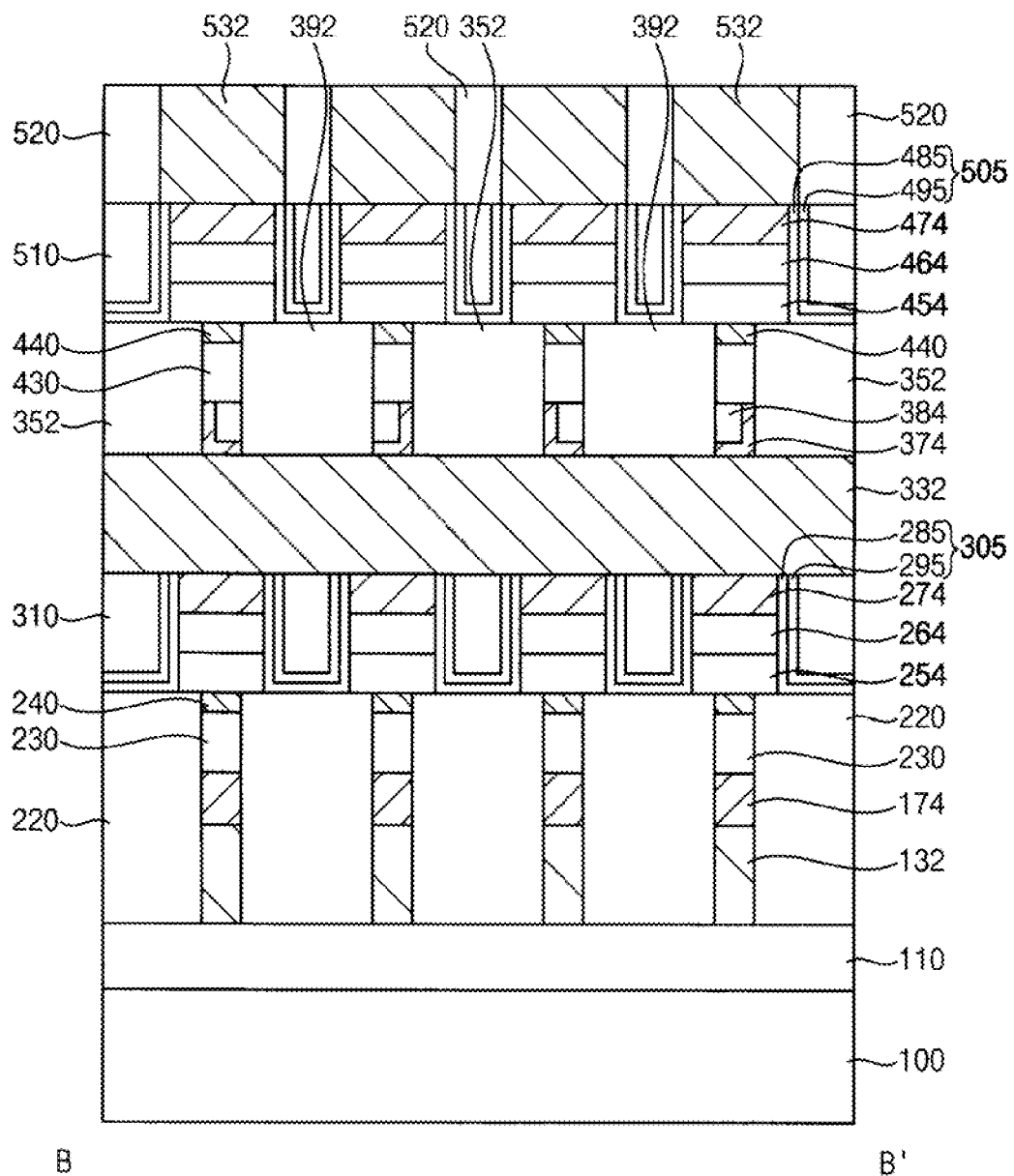
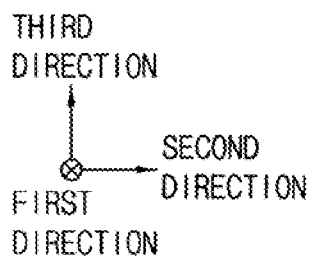

FIG. 39
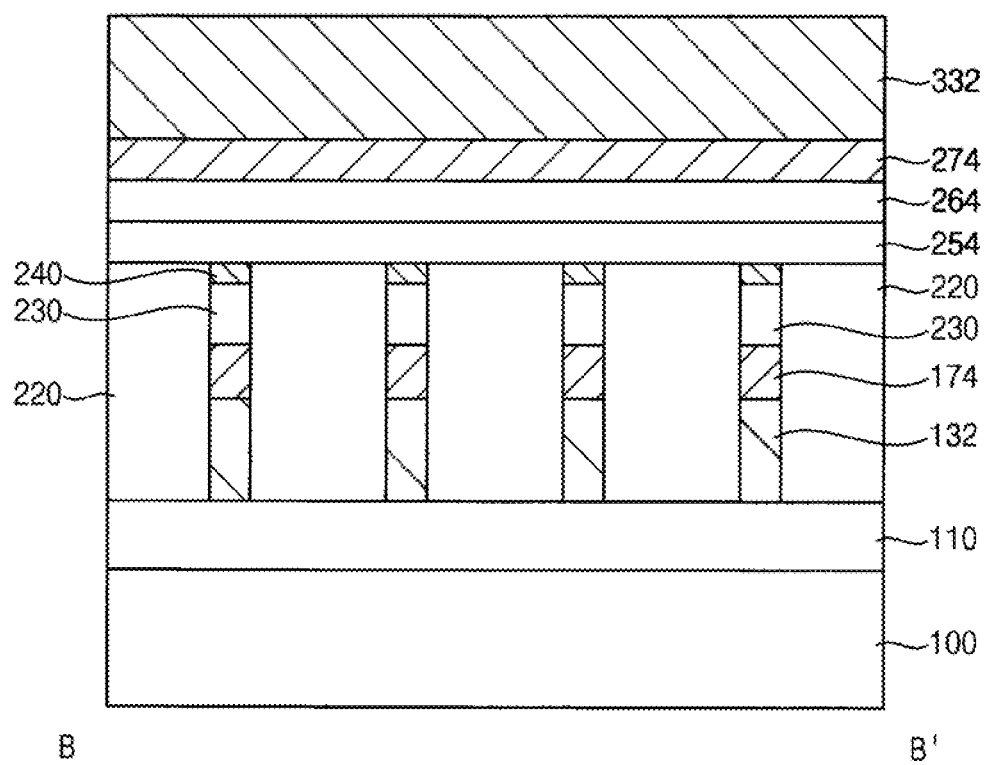
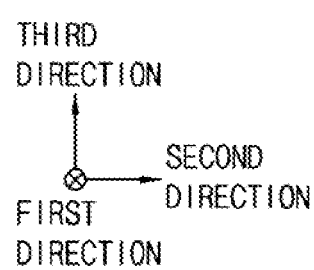

FIG. 40
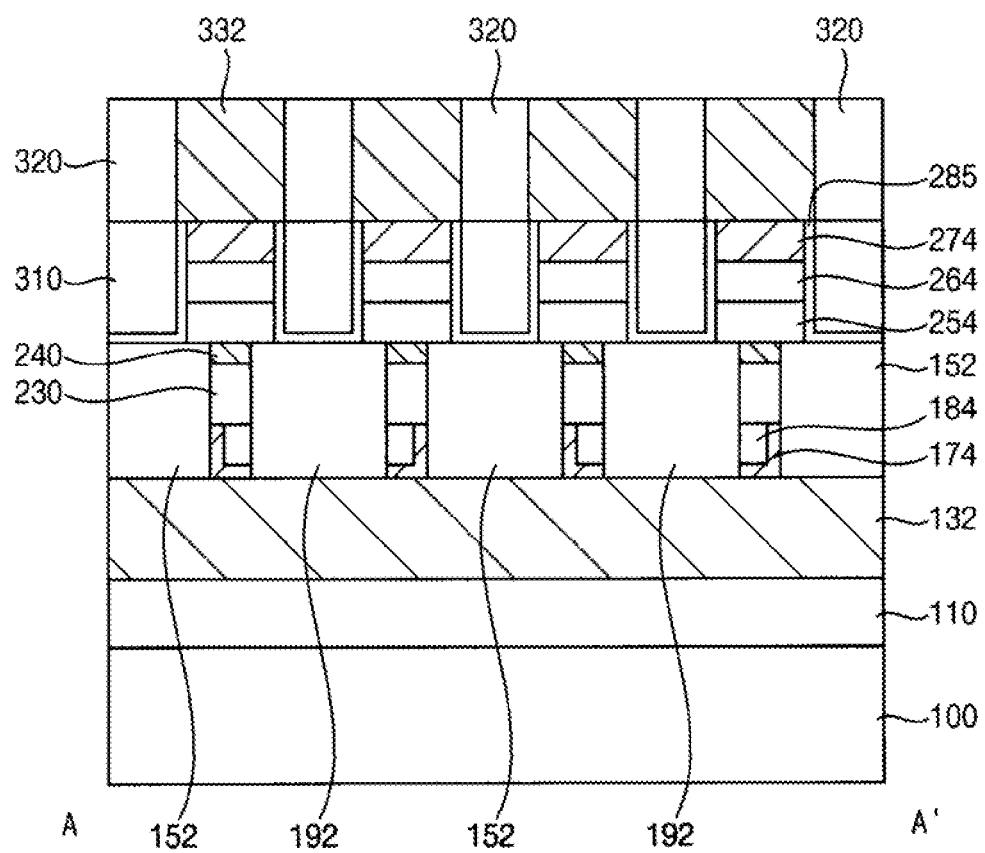
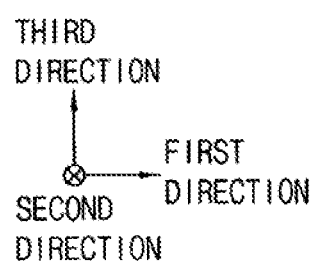

FIG. 44
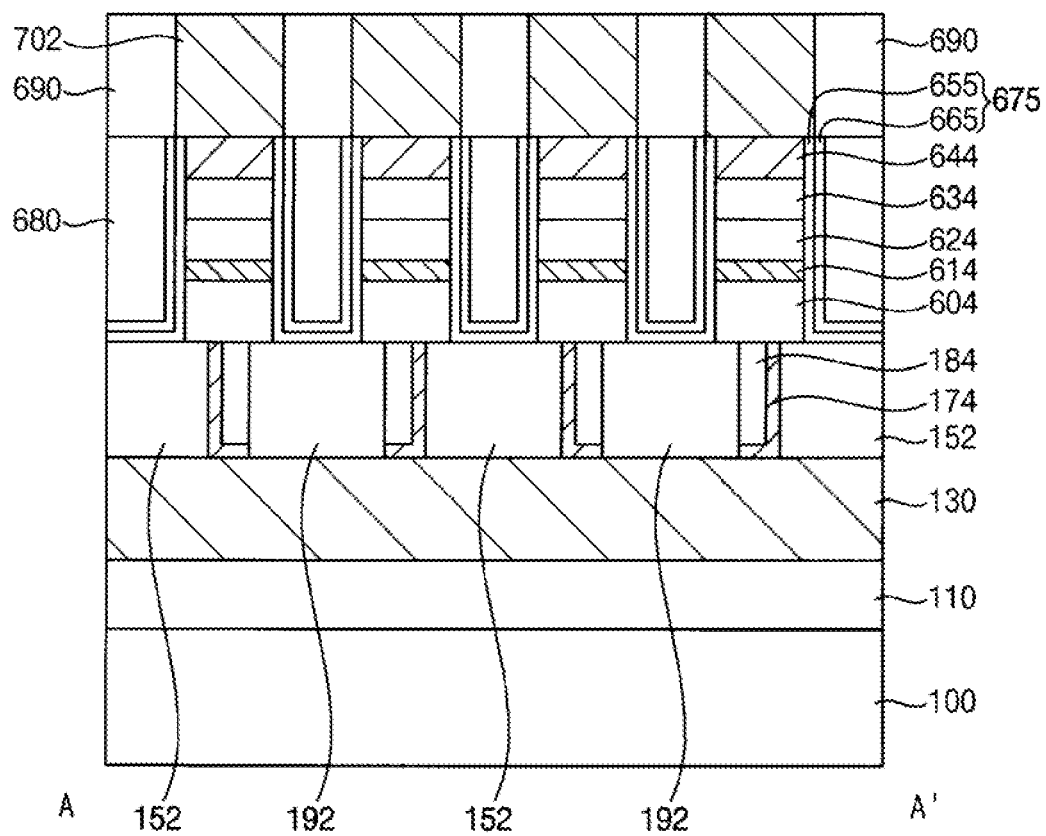
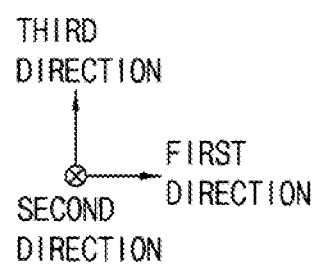

FIG. 45
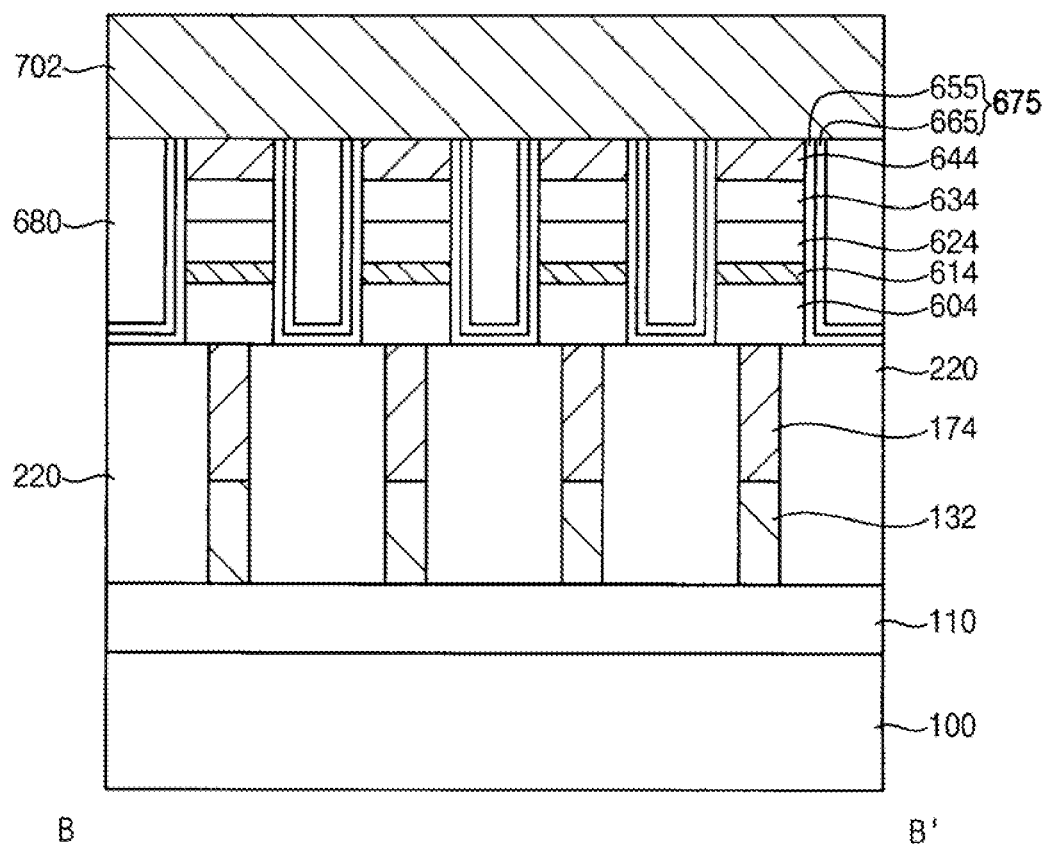
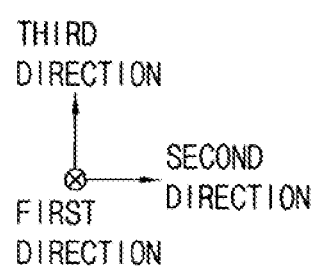

VARIABLE RESISTANCE MEMORY DEVICE INCLUDING SILICON CAPPING PATTERN

CROSS-REFERENCE TO RELATED APPLICATION

This application claims priority under 35 U.S.C. § 119 to Korean Patent Application No. 10-2018-0097951, filed on Aug. 22, 2018, in the Korean Intellectual Property Office (KIPO), the contents of which are herein incorporated by reference in their entirety.

TECHNICAL FIELD

Example embodiments of the present inventive concept relate to a variable resistance memory device and a method of manufacturing the same.

DISCUSSION OF RELATED ART

In a method of manufacturing a cross-point array phase change random access memory (PRAM) device, after patterning a phase change material layer and/or a selection layer to form a phase change material pattern and/or a selection pattern, respectively, an insulating interlayer may be formed to cover the phase change material pattern and/or the selection pattern. However, the phase change material pattern and/or the selection pattern may be vulnerable to moisture or a chemical used in forming the insulating interlayer, and may also be easily oxidized to cause deterioration.

SUMMARY

Example embodiments of the present inventive concept provide a variable resistance memory device having enhanced characteristics, and a method of manufacturing the same.

According to an example embodiment of the present inventive concept, there is provided a variable resistance memory device. The variable resistance memory device may include a memory unit including a first electrode disposed on a substrate, a variable resistance pattern disposed on the first electrode and a second electrode disposed on the variable resistance pattern, a selection pattern disposed on the memory unit, and a capping structure covering a sidewall of the selection pattern. The capping structure may include a first capping pattern and a second capping pattern sequentially stacked on at least one sidewall of the selection pattern. The first capping pattern may be silicon pattern, and the second capping pattern may include a nitride.

According to an example embodiment of the present inventive concept, there is provided a variable resistance memory device. The variable resistance memory device may include a plurality of memory units, each of the memory units including a first electrode disposed on a substrate, a variable resistance pattern disposed on the first electrode and a second electrode disposed on the variable resistance pattern, a plurality of selection patterns disposed on the memory units, and a plurality of capping structures covering sidewalls of the selection patterns. Each of the capping structures may include a first capping pattern and a second capping pattern sequentially stacked on at least one sidewall of each of the selection patterns. The first capping pattern may be amorphous silicon pattern, and second capping pattern may include a nitride.

According to an example embodiment of the present inventive concept, there is provided a variable resistance memory device. The variable resistance memory device may include a memory unit including a variable resistance pattern disposed on a substrate, a selection pattern disposed on the memory unit, and a capping structure covering sidewalls of the variable resistance pattern and the selection pattern. The capping structure may include a first capping pattern and a second capping pattern sequentially stacked. The first capping pattern may include amorphous silicon, and the second capping pattern may include a nitride.

According to an example embodiment of the present inventive concept, there is provided a variable resistance memory device. The variable resistance memory device may include first conductive lines spaced apart from each other in a second direction substantially parallel to an upper surface of a substrate, each of the first conductive lines extending in a first direction substantially parallel to the upper surface of a substrate and intersecting the second direction, second conductive lines spaced apart from each other in the first direction on the first conductive lines, each of the second conductive lines extending in the second direction, a memory unit disposed at each area at which the first and second conductive lines are overlapped with each other in a third direction substantially perpendicular to the upper surface of the substrate between the first and second conductive lines, a selection pattern disposed on the memory unit, and a capping structure covering a sidewall of the selection pattern. The capping structure may include a first capping pattern and a second capping pattern sequentially stacked on at least one sidewall of the selection pattern. The first capping pattern may include amorphous silicon, and the second capping pattern may include a nitride.

According to an example embodiment of the present inventive concept, there is provided a method of manufacturing a variable resistance memory device. The method may include forming a memory unit on a substrate, the memory unit including a variable resistance pattern, forming a selection pattern on the memory unit, forming a first capping layer to cover the selection pattern, the first capping layer including amorphous silicon, and forming a second capping layer on the first capping layer, the second capping layer including a nitride.

According to an example embodiment of the present inventive concept, there is provided a method of manufacturing a variable resistance memory device. The method may include forming a variable resistance pattern, a first electrode and a selection pattern sequentially stacked on a substrate, forming a first capping layer to cover sidewalls of the variable resistance pattern, the first electrode and the selection pattern, the first capping layer including amorphous silicon, and forming a second capping layer on the first capping layer, the second capping layer including a nitride.

According to an example embodiment of the present inventive concept, there is provided a method of manufacturing a variable resistance memory device. The method may include forming first conductive lines to be spaced apart from each other in a second direction substantially parallel to an upper surface of a substrate, each of the first conductive lines extending in a first direction substantially parallel to the upper surface of the substrate and intersecting the second direction, forming a memory unit and a selection pattern in a plural number along the first direction, the memory unit and the selection pattern sequentially stacked on each of the first conductive lines, forming a first capping layer to cover at least one sidewall of each of the plurality of selection patterns, the first capping layer including amorphous silicon, forming a second capping layer including a nitride on the first capping layer, and forming second conductive lines to be spaced apart from each other in the first direction, each of the second conductive lines extending in the second direction and overlapping the plurality of memory units in a third direction substantially perpendicular to the upper surface of the substrate, the plurality of memory units being arranged in the second direction.

In a variable resistance memory device in accordance with an example embodiment of the present inventive concept, a selection pattern and/or a variable resistance pattern may be covered by a capping structure, which may comprise a first capping pattern including amorphous silicon and a second capping pattern including a nitride. Accordingly, the modification of materials of the selection pattern and/or the variable resistance pattern may be suppressed to retain excellent characteristics.

BRIEF DESCRIPTION OF THE DRAWINGS

Example embodiments of the present inventive concept will be more clearly understood from the following detailed description taken in conjunction with the accompanying drawings, in which:

FIGS. 1 to 38 are plan views and cross-sectional views illustrating steps of a method of manufacturing a variable resistance memory device in accordance with an example embodiment of the present inventive concept;

FIG. 39 is a cross-sectional view illustrating a variable resistance memory device in accordance with an example embodiment of the present inventive concept;

FIGS. 40 and 41 are cross-sectional views illustrating a variable resistance memory device in accordance with an example embodiment of the present inventive concept; and FIGS. 42 to 45 are cross-sectional views illustrating a method of manufacturing a variable resistance memory device in accordance with an example embodiment of the present inventive concept.

Figure 1:
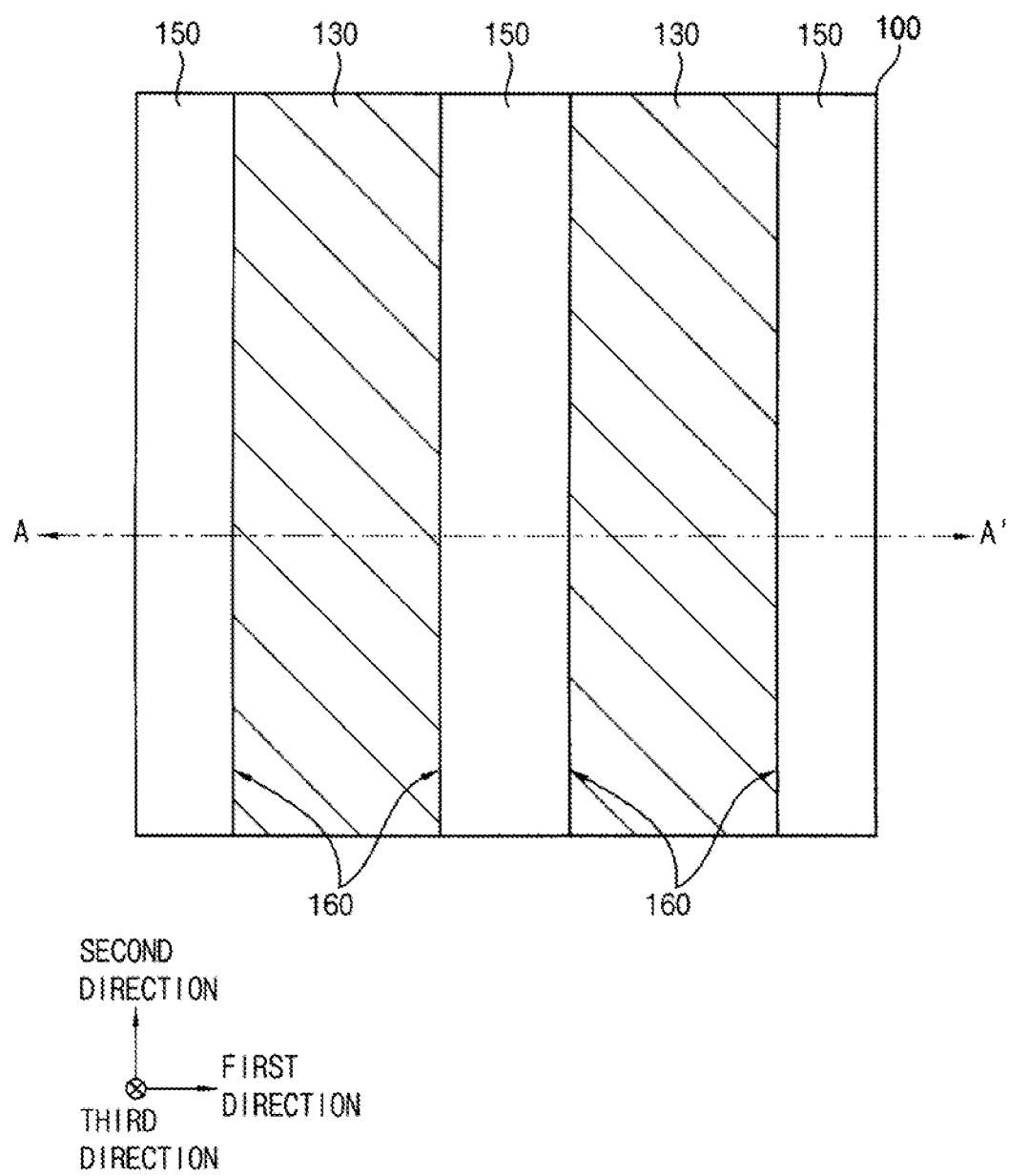

Since the drawings in FIGS. 1-45 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Example embodiments of the present inventive concept will be more clearly understood from the following detailed description taken in conjunction with the accompanying drawings.

FIGS. 1 to 38 are plan views and cross-sectional views illustrating steps of a method of manufacturing a variable resistance memory device in accordance with an example embodiment of the present inventive concept. Specifically, FIGS. 1, 3, 5, 10, 12, 15, 18, 23, 26, 29, 32 and 36 are plan views, and FIGS. 2, 4, 6-9, 11, 13-14, 16-17, 19-22, 24-25, 27-28, 30-31, 33-35 and 37-38 are cross-sectional views. FIGS. 2, 4, 6, 13, 16-17, 19, 21-22, 24, 27, 30, 33, 35 and 37 are cross-sectional views each taken along line A-A' of a corresponding plan view, respectively, and FIGS. 7-9, 11, 14, 20, 25, 28, 31, 34 and 38 are cross-sectional views each taken along line B-B' of a corresponding plan view, respectively.

Hereinafter, two directions intersecting with each other among horizontal directions substantially parallel to an upper surface of a substrate are defined as first and second directions, respectively, and a vertical direction substantially perpendicular to the upper surface of the substrate is defined as a third direction. In an example embodiment of the present inventive concept, the first and second directions may be orthogonal to each other. The third direction may be substantially perpendicular to the first and second directions.

Referring to FIGS. 1 and 2, a first insulating interlayer 110 and a first conductive layer 130 may be sequentially formed on a substrate 100.

The substrate 100 may include group IV semiconductor materials, e.g., silicon (Si), germanium (Ge), silicon-germanium (SiGe), etc., or III-V compounds e.g., gallium phosphide (GaP), gallium arsenide (GaAs), gallium antimonide (GaSb), etc. In an example embodiment of the present inventive concept, the substrate 100 may be a silicon-on-insulator (SOI) substrate or a germanium-on-insulator (GOI) substrate.

Various elements, e.g., a gate structure, a source/drain layer, a contact plug, a wiring, etc., may be formed on the substrate 100, and may be covered by the first insulating interlayer 110. In an example embodiment of the present inventive concept, the substrate 100 may include one or more semiconductor layers or structures, and may include active or operable portions of semiconductor devices. The first insulating interlayer 110 may include an oxide, e.g., a silicon oxide ($SiO_2$).

The first conductive layer 130 may include a metal and/or a metal nitride. The metal may include, e.g., tungsten (W), platinum (Pt), copper (Cu), aluminum (Al), titanium (Ti), tantalum (Ta), etc., and the metal nitride may include, e.g., titanium nitride ($TiN_x$), tungsten nitride ($WN_x$), tantalum nitride ($TaN_x$), zirconium nitride ($ZrN_x$), etc. The first conductive layer 130 may have a single layer structure, or a multi-layered structure in which a plurality of layers may be stacked.

A second insulating interlayer 150 may be formed on the first conductive layer 130.

The second insulating interlayer 150 may include a first opening 160 extending in the second direction to expose an upper surface of the first conductive layer 130. In an example embodiment of the present inventive concept, a plurality of first openings 160 may be formed along the first direction. For example, the plurality of first openings 160 may be spaced apart from each other in the first direction and may extend in parallel with each other in the second direction. The second insulating interlayer 150 may include an oxide, e.g., silicon oxide ($SiO_2$).

Figure 3:
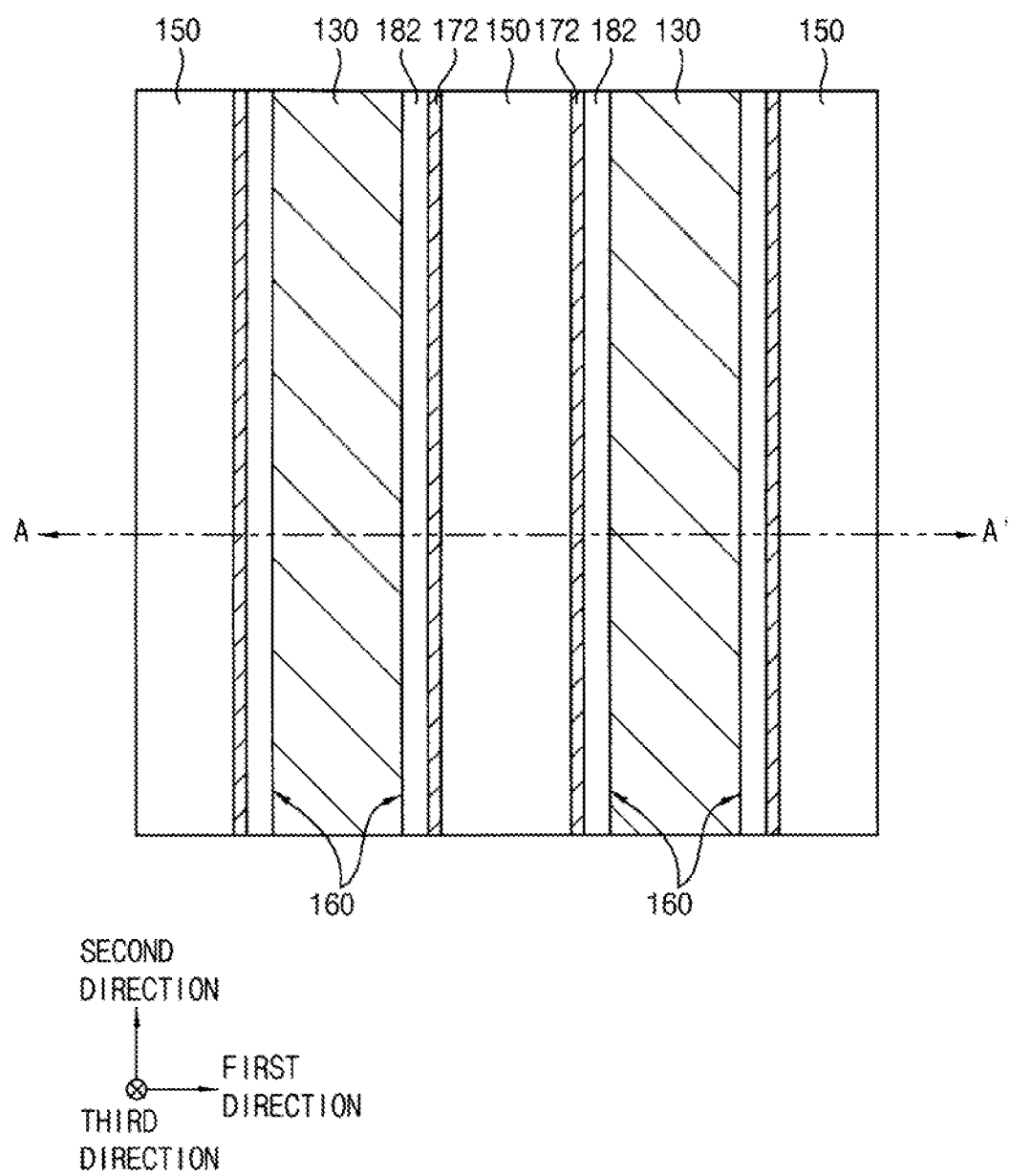

Referring to FIGS. 3 and 4, a first electrode layer and a first spacer layer may be sequentially and conformally formed on a sidewall of the first opening 160, the upper surface of the first conductive layer 130 exposed by the first opening 160 and an upper surface of the second insulating interlayer 150, and the first spacer layer may be anisotropically etched to form a preliminary first spacer 182 on a portion of the first electrode layer formed on the sidewall of the first opening 160.

The first electrode layer may include, e.g., a metal nitride such as titanium nitride ($TiN_x$), tungsten nitride ($WN_x$), tantalum nitride ($TaN_x$), zirconium nitride ($ZrN_x$), titanium aluminum nitride ($TiAlN_x$) etc., and the first spacer layer may include, e.g., an oxide such as silicon oxide ($SiO_2$), or e.g., a carbon (C) containing material such as carbonitride (CN), titanium carbonitride (TiCN), titanium carbide (TiC), tungsten carbide (WC), etc. However, the present inventive concept may not be limited thereto. For example, the first electrode layer may include, e.g., a metal silicon nitride such as titanium silicon nitride (TiSiN$_x$), tungsten silicon nitride (WSiN$_x$), tantalum silicon nitride (TaSiN$_x$), zirconium silicon nitride (ZrSiN$_x$), etc.

In an example embodiment of the present inventive concept, the preliminary first spacer 182 may be formed on not only the portion of the first electrode layer formed on the sidewall of the first opening 160, but also a portion formed on a lower surface of the first opening 160, that is, a portion of the first electrode layer formed on the upper surface of the first conductive layer 130 exposed by the first opening 160.

In an example embodiment of the present inventive concept, the preliminary first spacers 182 may be formed on both sidewalls in the first direction of the first opening 160, respectively, with the first electrode layer interposed therebetween, and each of the preliminary first spacers 182 may extend in the second direction.

The first electrode layer may be anisotropically etched using the preliminary first spacer 182 as an etching mask to form a preliminary first electrode 172.

Since the preliminary first spacer 182 exists only on the sidewall and a portion of the lower surface of the first opening 160 with the preliminary first electrode 172 interposed therebetween, the preliminary first electrode 172 may also remain only on the sidewall and a portion of the lower surface of the first opening 160, and thus the preliminary first electrode 172 may have an L-shaped cross-section taken along the first direction. In an example embodiment of the present inventive concept, the preliminary first electrodes 172 may be formed on the both sidewalls in the first direction of the first opening 160, respectively, and each of the preliminary first electrodes 172 may extend in the second direction.

Figure 5:
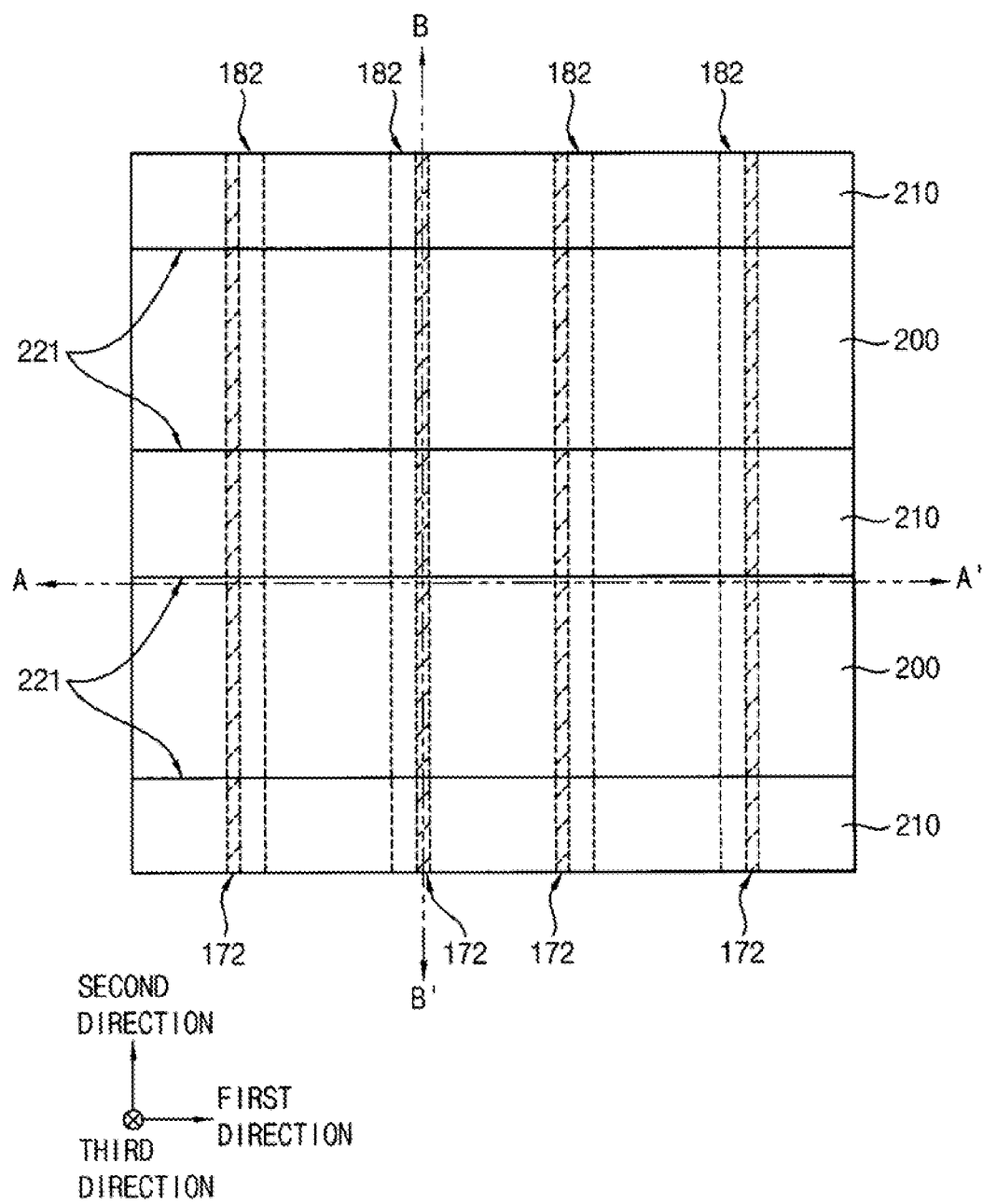

Referring to FIGS. 5 to 7, after forming a third insulating interlayer 190 sufficiently filling the first opening 160 on the first conductive layer 130, the preliminary first electrode 172, and the preliminary first spacer 182 and the second insulating interlayer 150, the third insulating interlayer 190 may be planarized until the upper surface of the second insulating interlayer 150 is exposed. Accordingly, the third insulating interlayer 190 may fill a remaining portion of the first opening 160.

The third insulating interlayer 190 may include an oxide, e.g., silicon oxide (SiO$_2$).

The planarization process may be performed by, e.g., a chemical mechanical polishing (CMP) process and/or an etch back process. Upper portions of the second insulating interlayer 150, the preliminary first electrode 172 and the preliminary first spacer 182 altogether may be removed during the planarization process, and thus each of the preliminary first electrode 172 and the preliminary first spacer 182 may have a flat upper surface. For example, the planarization process may be performed until both the preliminary first electrode 172 and the preliminary first spacer 182 have flat upper surfaces.

A first mask layer 200 and a sacrificial layer 210 may be sequentially formed on the second and third insulating interlayers 150 and 190, the preliminary first electrode 172 and the preliminary first spacer 182.

In an example embodiment of the present inventive concept, the sacrificial layer 210 may include a second opening 221 extending in the first direction to expose an upper surface of the first mask layer 200, and a plurality of second openings 221 may be formed along the second direction. For example, the plurality of second openings 221 may be spaced apart from each other in the second direction and may extend in parallel with each other in the first direction.

The first mask layer 200 may include, e.g., polysilicon (Si), and the sacrificial layer 210 may include, e.g., amorphous carbon layer (ACL), spin-on organic hardmask (SOH), silicon nitride (Si$_3$N$_4$), etc., however, the present inventive concept may not be limited thereto.

Figure 8:
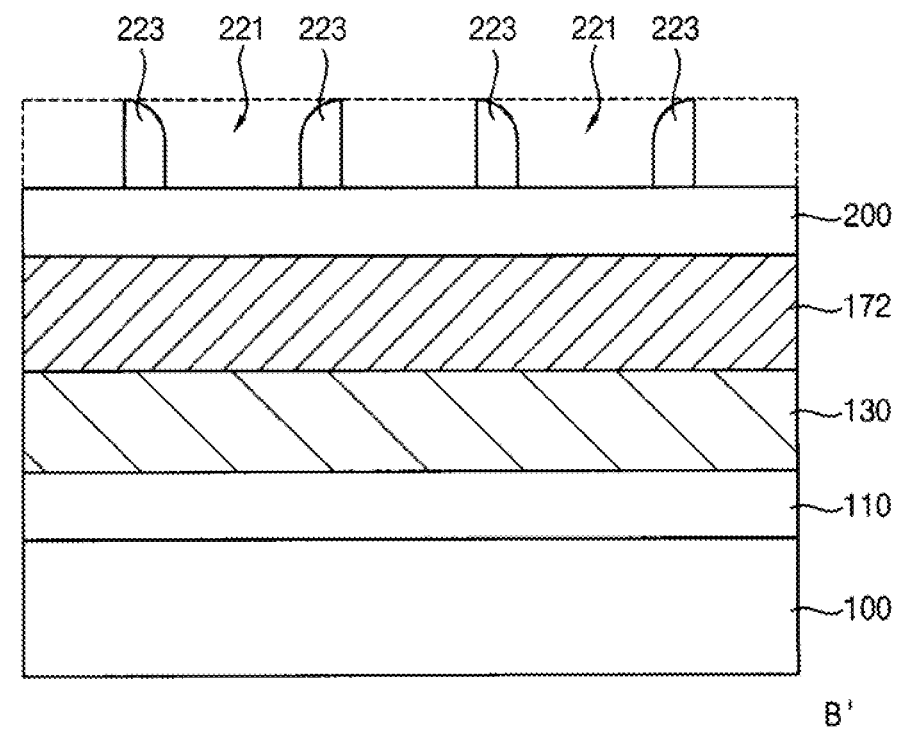

Referring to FIG. 8, after conformally forming a second mask layer on a sidewall of the second opening 221, the upper surface of the first mask layer 200 exposed by the second opening 221 and the sacrificial layer 210, the second mask layer may be anisotropically etched to form a second mask 223 on the sidewall of the second opening 221. The anisotropic etching process may be performed on the second mask layer until the upper surface of the first mask layer 200 is exposed to form the second mask 223.

The second mask layer may include an oxide, e.g., silicon oxide (SiO$_2$). In an example embodiment of the present inventive concept, the second mask layer may be formed by an atomic layer deposition (ALD) process.

After forming the second mask 223, the sacrificial layer 210 may be removed. In an example embodiment of the present inventive concept, the sacrificial layer 210 may be removed by a wet or dry etching process.

Figure 9:
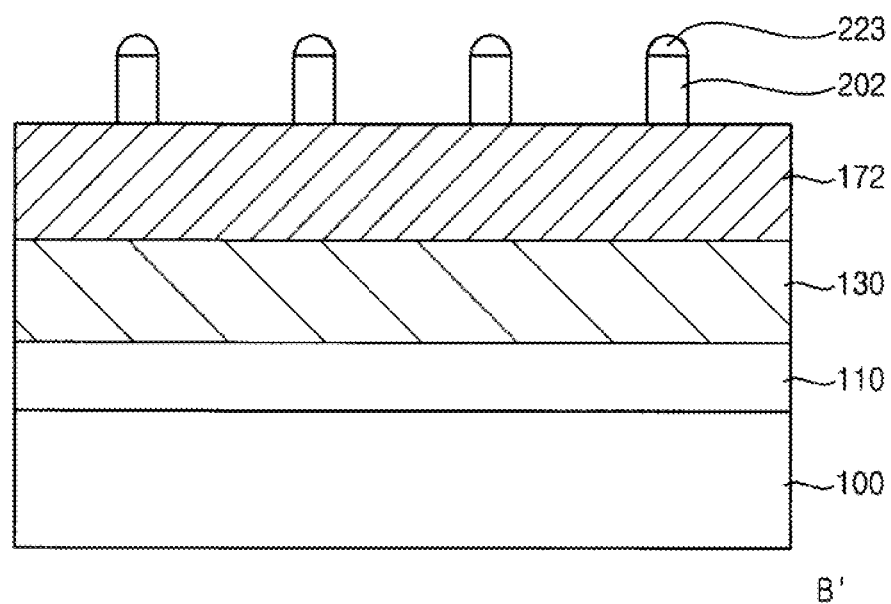

Referring to FIG. 9, the first mask layer 200 may be etched using the second mask 223 as an etching mask, and thus a first mask 202 may be formed. During the etching process, the second mask 223 may also be partially removed.

In an example embodiment of the present inventive concept, the first mask 202 may extend in the first direction, and a plurality of first masks 202 may be formed along the second direction. For example, the plurality of first masks 202 may be spaced apart from each other in the second direction and may extend in parallel with each other in the first direction.

Figure 10:
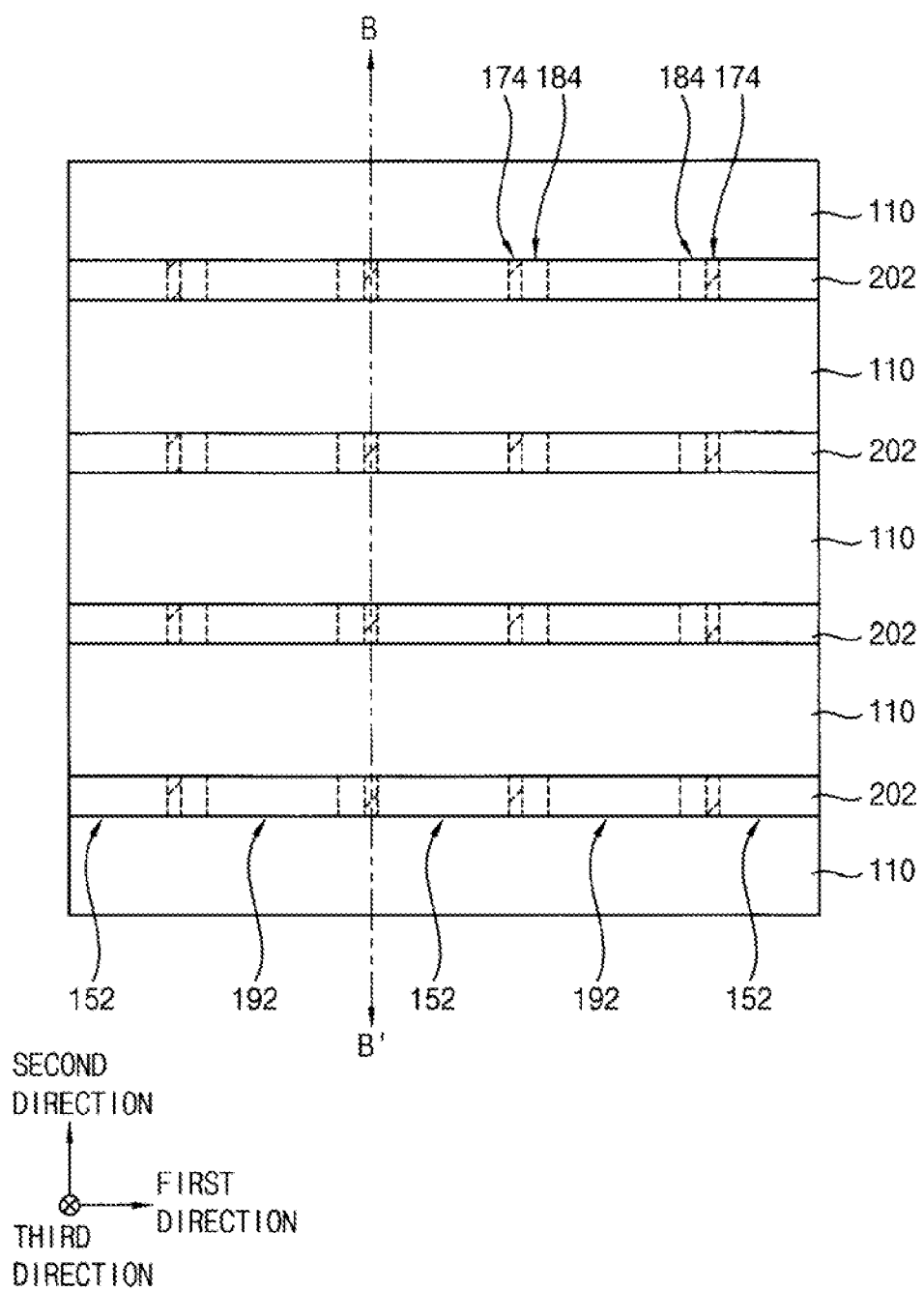
Figure 11:
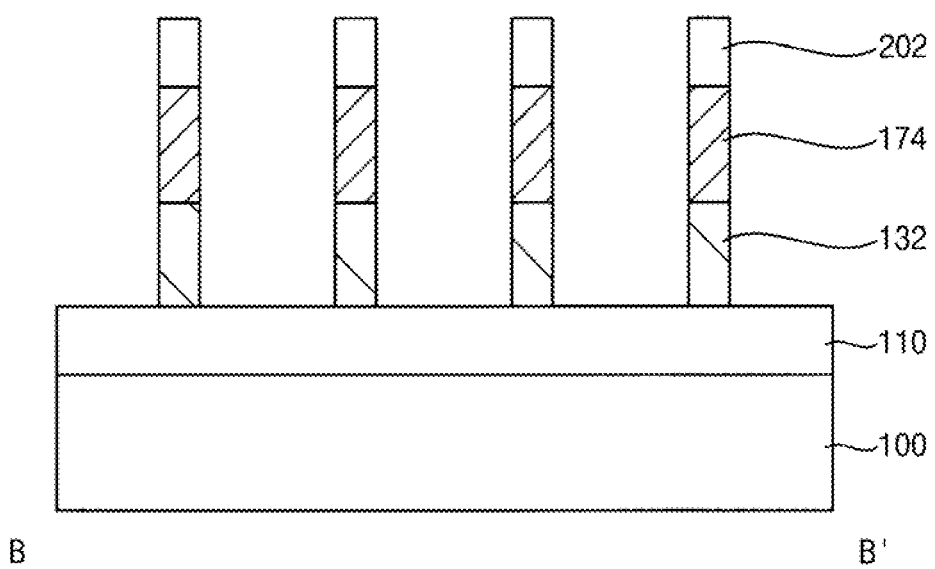

Referring to FIGS. 10 and 11, the preliminary first electrode 172, the preliminary first spacer 182, the second and third insulating interlayers 150 and 190 and the first conductive layer 130 may be sequentially etched using the first mask 202 as an etching mask to form a first electrode 174, a first spacer 184, second and third interlayer insulation patterns 152 and 192, and a first conductive line 132, respectively.

In an example embodiment of the present inventive concept, the first conductive line 132 may extend in the first direction, and a plurality of first conductive lines 132 may be formed along the second direction. For example, the plurality of first conductive lines 132 may be spaced apart from each other in the second direction and may extend in parallel with each other in the first direction. In an example embodiment of the present inventive concept, the first conductive line 132 may serve as a word line of the variable resistance memory device. Alternatively, the first conductive line 132 may serve as a bit line.

In an example embodiment of the present inventive concept, a plurality of first electrodes 174 may be formed along each of the first and second directions, and a plurality of first spacers 184 may also be formed along each of the first and second directions. For example, the plurality of first electrodes 174 may form islands spaced apart from each other in the first and second directions in a plan view. Similarly, the plurality of first spacers 184 may also form islands spaced apart from each other in the first and second directions in a plan view.

Figure 12:
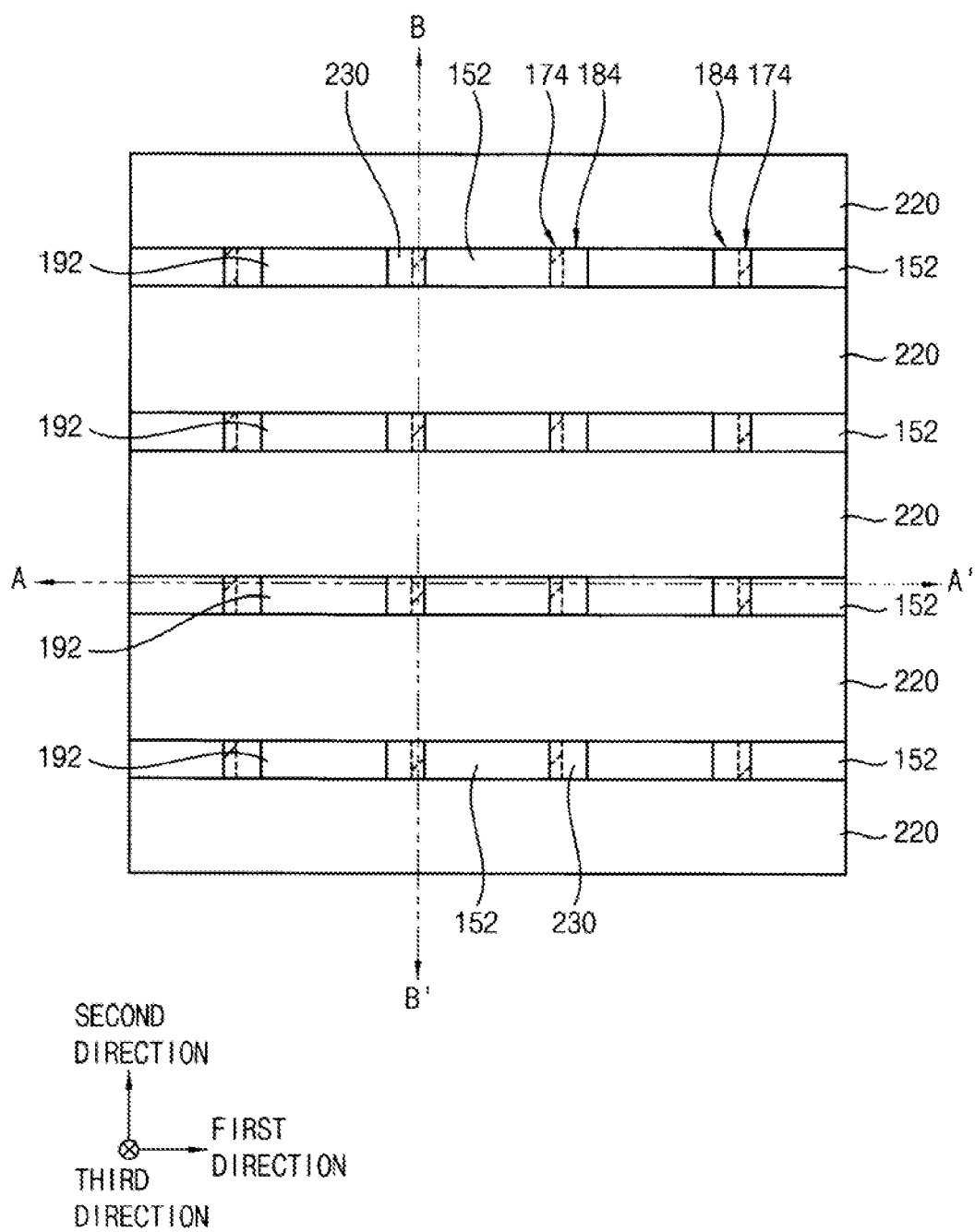
Figure 13:
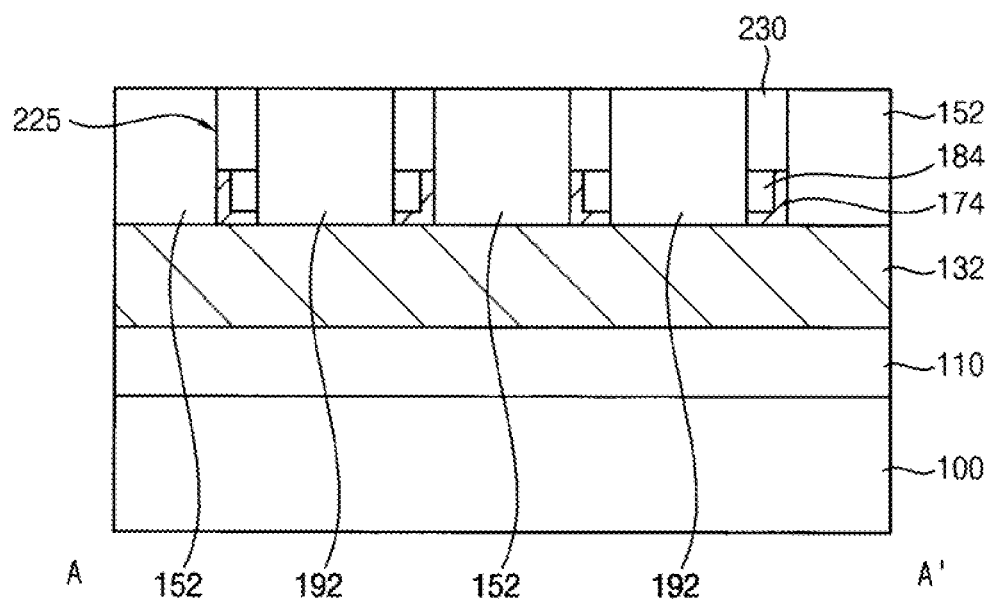

Referring to FIGS. 12 to 14, after removing the first mask 202, a fourth insulating interlayer 220 may be formed on the first insulating interlayer 110 to cover a first structure, which may include the first electrode 174, the first spacer 184, the second and third interlayer insulation patterns 152 and 192 and the first conductive line 132, and extend in the first direction, and an upper surface of the fourth insulating interlayer 220 may be planarized until upper surfaces of the first electrode 174 and the first spacer 184 are exposed. The planarization process may be performed by, e.g., a chemical mechanical polishing (CMP) process and/or an etch back process.

The fourth insulating interlayer 220 may include an oxide, e.g., silicon oxide ($SiO_2$).

After removing upper portions of the first electrode 174 and the first spacer 184 to form a first recess 225, a first variable resistance pattern 230 may be formed to fill the first recess 225.

The first variable resistance pattern 230 may be formed by forming a first variable resistance layer on the first electrode 174 and the first spacer 184 of which the upper portions are removed, the fourth insulating interlayer 220, and the second and third interlayer insulation patterns 152 and 192, and planarizing the first variable resistance layer until the upper surface of the fourth insulating interlayer 220 is exposed. The planarization process may be performed by, e.g., a chemical mechanical polishing (CMP) process and/or an etch back process.

In an example embodiment of the present inventive concept, the first variable resistance layer may include a phase change material of which a resistance may change according to the phase thereof. In an example embodiment of the present inventive concept, the first variable resistance layer may include a chalcogenide-based material in which germanium (Ge), antimony (Sb) and/or tellurium (Te) may be combined in a given ratio. For example, the first variable resistance layer may include germanium antimony telluride ($Ge_2Sb_2Te_5$, GST) which is one of the commonly used chalcogenide-based materials. In an example embodiment of the present inventive concept, the first variable resistance layer may include a super lattice in which germanium telluride (GeTe) and antimony telluride (SbTe) may be repeatedly stacked. In an example embodiment of the present inventive concept, the first variable resistance layer may include, for example, indium antimony telluride (InSbTe, IST), or bismuth antimony telluride (BiSbTe, BST). The first variable resistance layer may further include, for example, carbon (C), nitride (N), boron (B), oxygen (O), etc.

In an example embodiment of the present inventive concept, the first variable resistance layer may include a perovskite-based material, a transition metal oxide, or a ferromagnetic material. The perovskite-based material may include, e.g., strontium titanate ($SrTiO_3$, STO), barium titanate ($BaTiO_3$, BTO), $Pr_{1-x}Ca_xMnO_3$ (PCMO), etc. The transition metal oxide may include, e.g., titanium oxide ($TiO_x$), zirconium oxide ($ZrO_x$), aluminum oxide ($AlO_x$), hafnium oxide ($HfO_x$), etc. These may be used alone or in a combination thereof. The ferromagnetic material may include, e.g., iron (Fe), cobalt (Co), nickel (Ni), Gadolinium (Gd), Terbium (Tb), dysprosium (Dy), etc.

The first variable resistance pattern 230 may be formed on the upper surfaces of the first electrode 174 and the first spacer 184, and thus a plurality of first variable resistance patterns 230 may be formed along each of the first and second directions. For example, the first spacer 184 may be formed on the first electrode 174, so that the upper surface of the first spacer 184 together with the upper surface of the first electrode 174 may contact a lower surface of the first variable resistance pattern 230.

Figure 15:
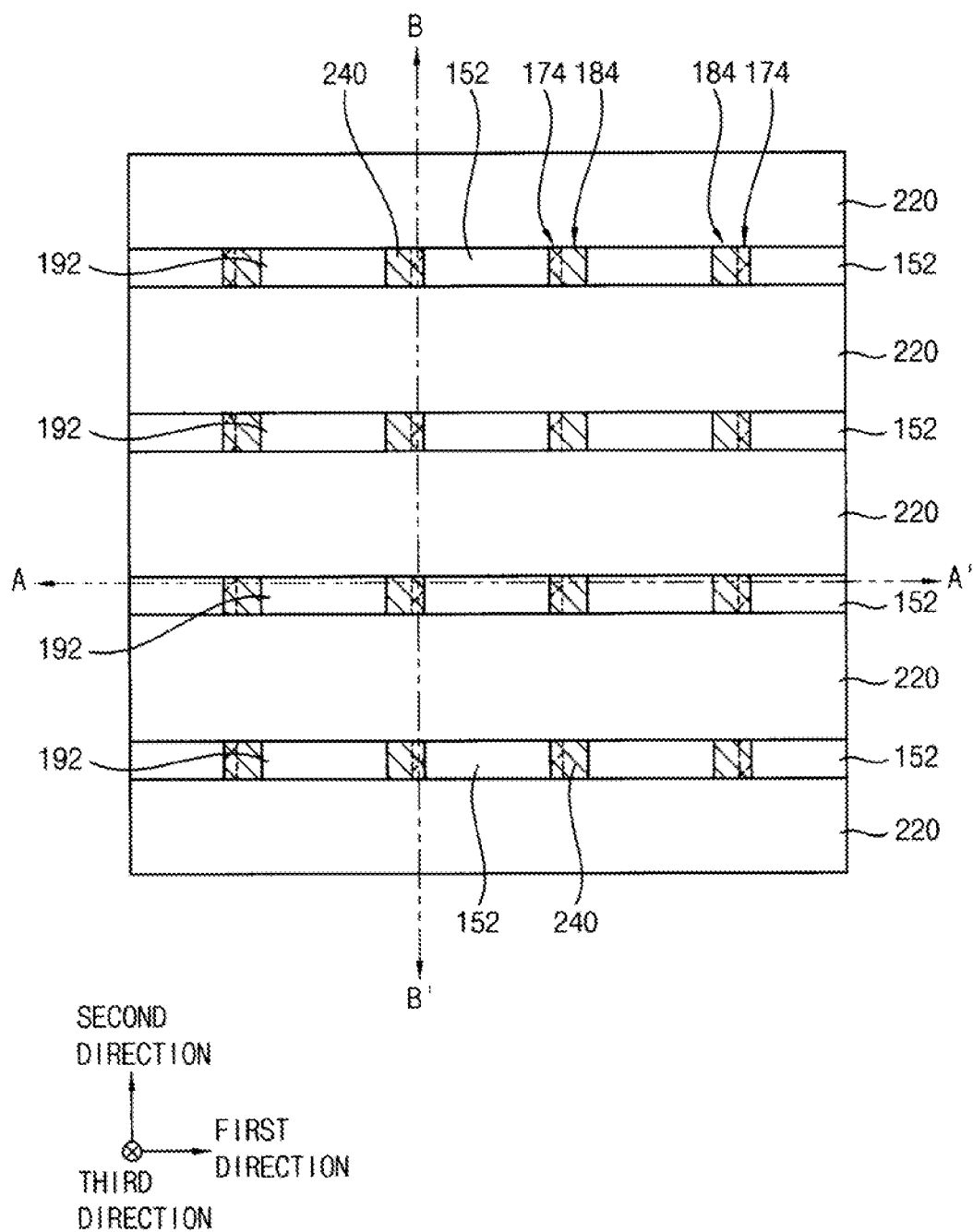

Referring to FIGS. 15 and 16, after removing an upper portion of the first variable resistance pattern 230 to form a second recess 227, a second electrode 240 may be formed to fill the second recess 227.

The second electrode 240 may be formed by forming a second electrode layer sufficiently filling the second recess 227 on the first variable resistance pattern 230 of which the upper portion is removed, the fourth insulating interlayer 220, and the second and third interlayer insulation patterns 152 and 192, and planarizing the second electrode layer until the upper surface of the fourth insulating interlayer 220 is exposed. The planarization process may be performed by, e.g., a chemical mechanical polishing (CMP) process and/or an etch back process.

The second electrode layer may include a metal nitride, e.g., titanium nitride ($TiN_x$), tungsten nitride ($WN_x$), tantalum nitride (TaN), zirconium nitride ($ZrN_x$), etc. However, the present inventive concept may not be limited thereto. For example, the second electrode layer may include, e.g., a metal silicon nitride such as titanium silicon nitride ($TiSiN_x$), tungsten silicon nitride ($WSiN_x$), tantalum silicon nitride ($TaSiN_x$), zirconium silicon nitride ($ZrSiN_x$), etc.

The second electrode 240 may be formed on an upper surface of the first variable resistance pattern 230, and thus a plurality of second electrodes 240 may be formed along each of the first and second directions. For example, the plurality of second electrodes 240 may form islands spaced apart from each other in the first and second directions in a plan view. In an example embodiment of the present inventive concept, a lower surface of the second electrode 240 may have a shape and an area substantially the same as those of the upper surface of the first variable resistance pattern 230.

The first electrode 174, the first variable resistance pattern 230 and the second electrode 240 sequentially stacked may form a first memory unit.

Figure 17:
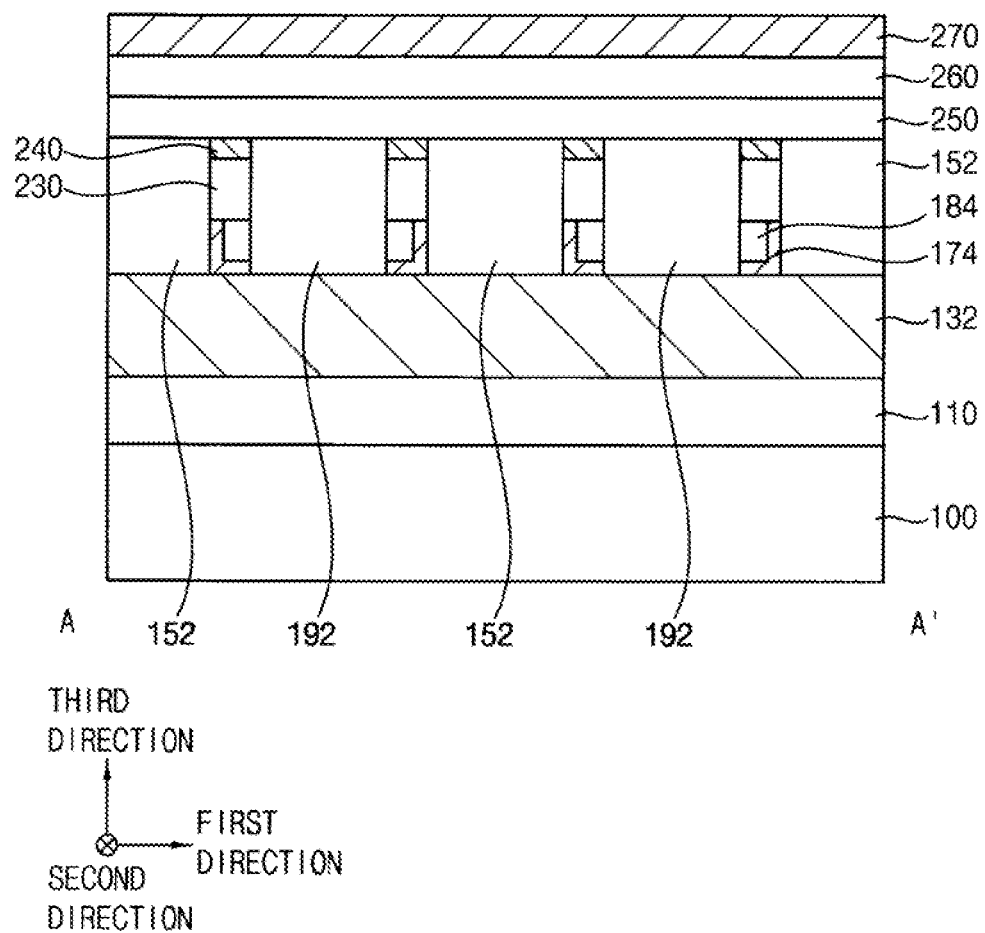

Referring to FIG. 17, a first selection layer 250, a first buffer layer 260 and a third electrode layer 270 may be sequentially formed on the second electrode 240, the fourth insulating interlayer 220, and the second and third interlayer insulation patterns 152 and 192.

In an example embodiment of the present inventive concept, the first selection layer 250 may include an Ovonic threshold switching (OTS) material, which may serve as a switching function due to a resistance difference depending on an applied voltage while maintaining an amorphous state. The resistance of the OTS material may vary greatly according to a temperature thereof in the amorphous state.

The OTS material may include, e.g., germanium (Ge), silicon (Si), arsenic (As) and/or tellurium (Te), and may further include selenium (Se), sulfur (S), carbon (C), nitrogen (N), indium (In), boron (B), etc.

The OTS material may include, e.g., AsTeGeSiIn, GeTe, SnTe, GeSe, SnSe, AsTeGeSiSbS, AsTeGeSiInP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P_1$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, etc.

In an example embodiment of the present inventive concept, the first selection layer 250 may include polysilicon layers doped with n-type and p-type impurities, respectively.

The first buffer layer 260 may include carbon (C) or a carbon-containing metal. For example, the first buffer layer 260 may include carbon (C), carbonitride (CN), titanium carbonitride (TiCN) and/or tantalum carbonitride (TaCN).

The third electrode layer 270 may include, e.g., titanium nitride (TiN$_x$), tungsten nitride (WN$_x$), tantalum nitride (TaN$_x$), zirconium nitride (ZrN$_x$), etc. However, the present inventive concept may not be limited thereto. For example, the third electrode layer 270 may include, e.g., a metal silicon nitride such as titanium silicon nitride (TiSiN$_x$), tungsten silicon nitride (WSiN$_x$), tantalum silicon nitride (TaSiN$_x$), zirconium silicon nitride (ZrSiN$_x$), etc.

Figure 18:
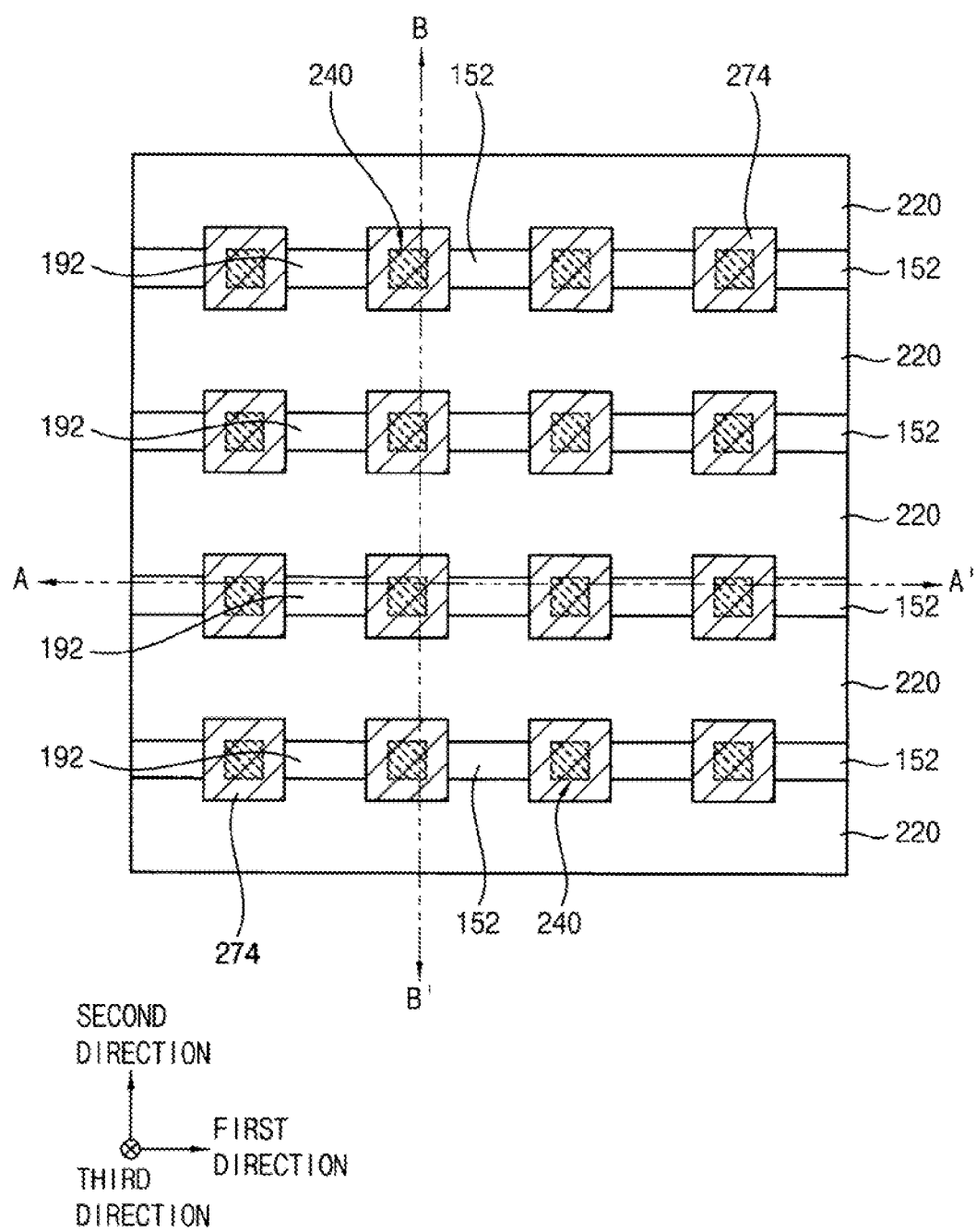
Figure 19:
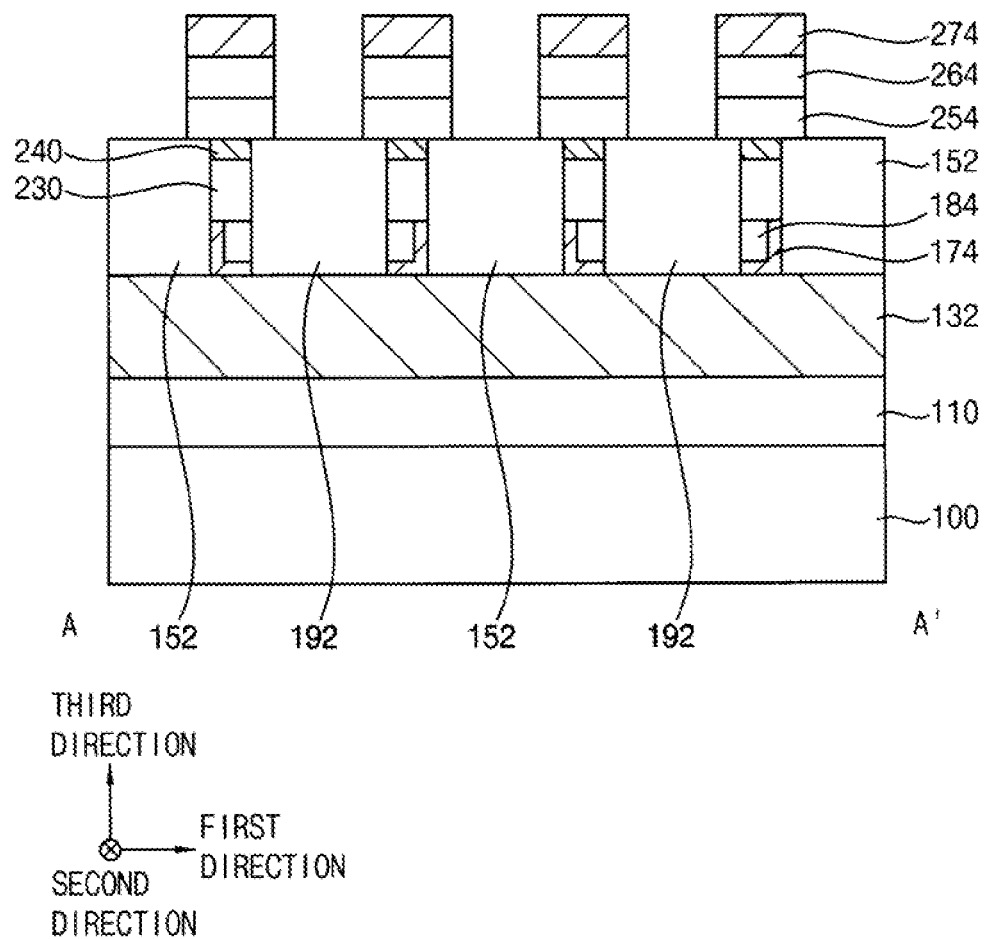

Referring to FIGS. 18 to 20, the first selection layer 250, the first buffer layer 260 and the third electrode layer 270 may be patterned to form a second structure including a first selection pattern 254, a first buffer pattern 264 and a third electrode 274 sequentially stacked on the second electrode 240, the fourth insulating interlayer 220, and the second and third interlayer insulation patterns 152 and 192.

In an example embodiment of the present inventive concept, the second structure may be formed on each of the second electrodes 240, and thus a plurality of second structures may be formed to be spaced apart from each other along each of the first and second directions.

Figure 21:
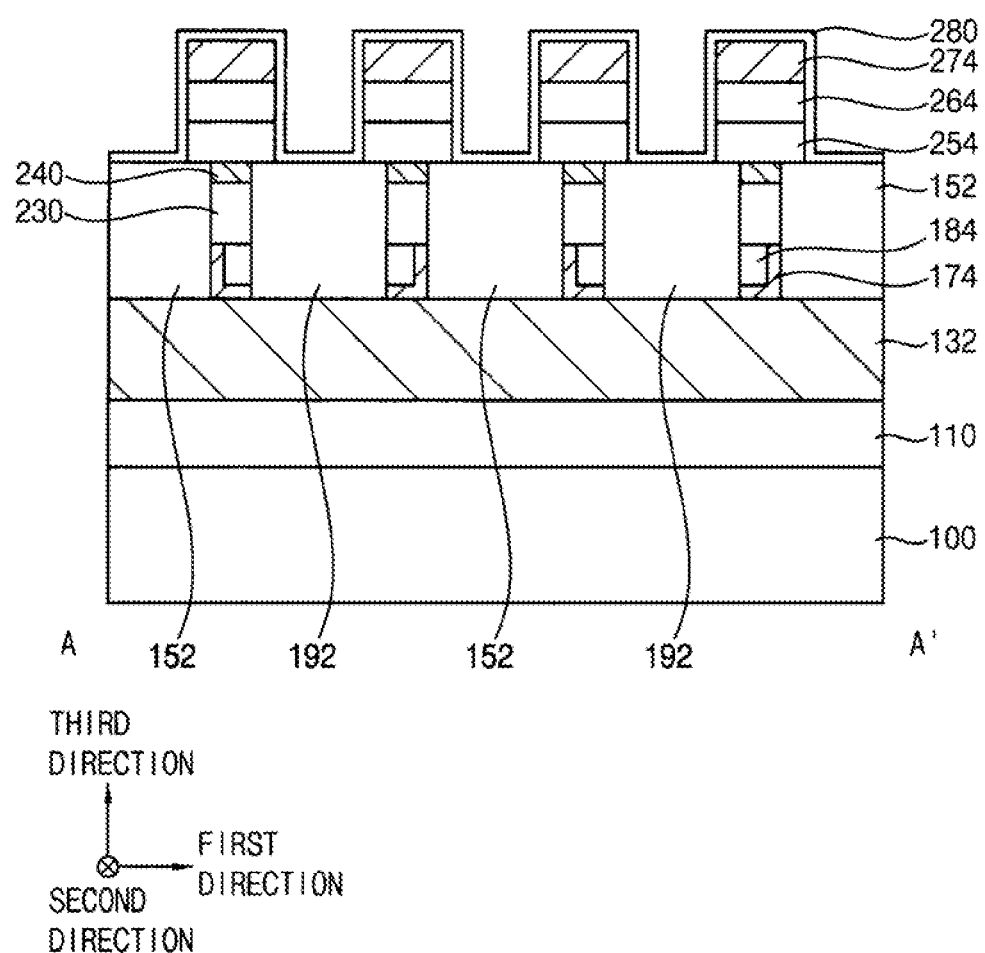

Referring to FIG. 21, a first capping layer 280 may be conformally formed on the fourth insulating interlayer 220, and the second and third interlayer insulation patterns 152 and 192 to cover the second structure.

In an example embodiment of the present inventive concept, the first capping layer 280 may be formed by a deposition process using a silicon (Si) source gas and an inert gas. The deposition process may include, for example, an atomic layer deposition (ALD) process or a chemical vapor deposition (CVD) process. The silicon (Si) source gas may include, e.g., silane (SiH$_4$) gas, and the inert gas may include, e.g., helium (He), argon (Ar), etc. Other silicon (Si) source gas such as, e.g., disilane (Si$_2$H$_6$), diiodosilane (SiH$_2$I$_2$), dichlorosilane (SiH$_2$Cl$_2$), etc. may also be used.

As the first capping layer 280 may be formed to cover the second structure including the first selection pattern 254 that may include the OTS material, an oxidation of the first selection pattern 254 may be prevented. The first capping layer 280 may be formed using only the silicon (Si) source gas and the inert gas so as not to react with the first selection pattern 254 during the deposition process, and thus the composition of the first selection pattern 254 may not be changed. Although the amorphous silicon (Si) included in the first capping layer 280 may not be combined with the OTS material included in the first selection pattern 254 to deteriorate it, but may not be sufficient to prevent moisture and residual chemicals from penetrating through. Thus, a nitride layer may be further formed to cover the second structure including the first selection pattern 254, so that the whole capping layer may have a bilayer structure.

In an example embodiment of the present inventive concept, the first capping layer 280 may be a silicon pattern, the silicon pattern may include amorphous silicon (Si), and thus the first capping layer 280 may be an amorphous silicon pattern. Accordingly, the first capping layer 280 may not serve as a path of leakage current.

Figure 22:
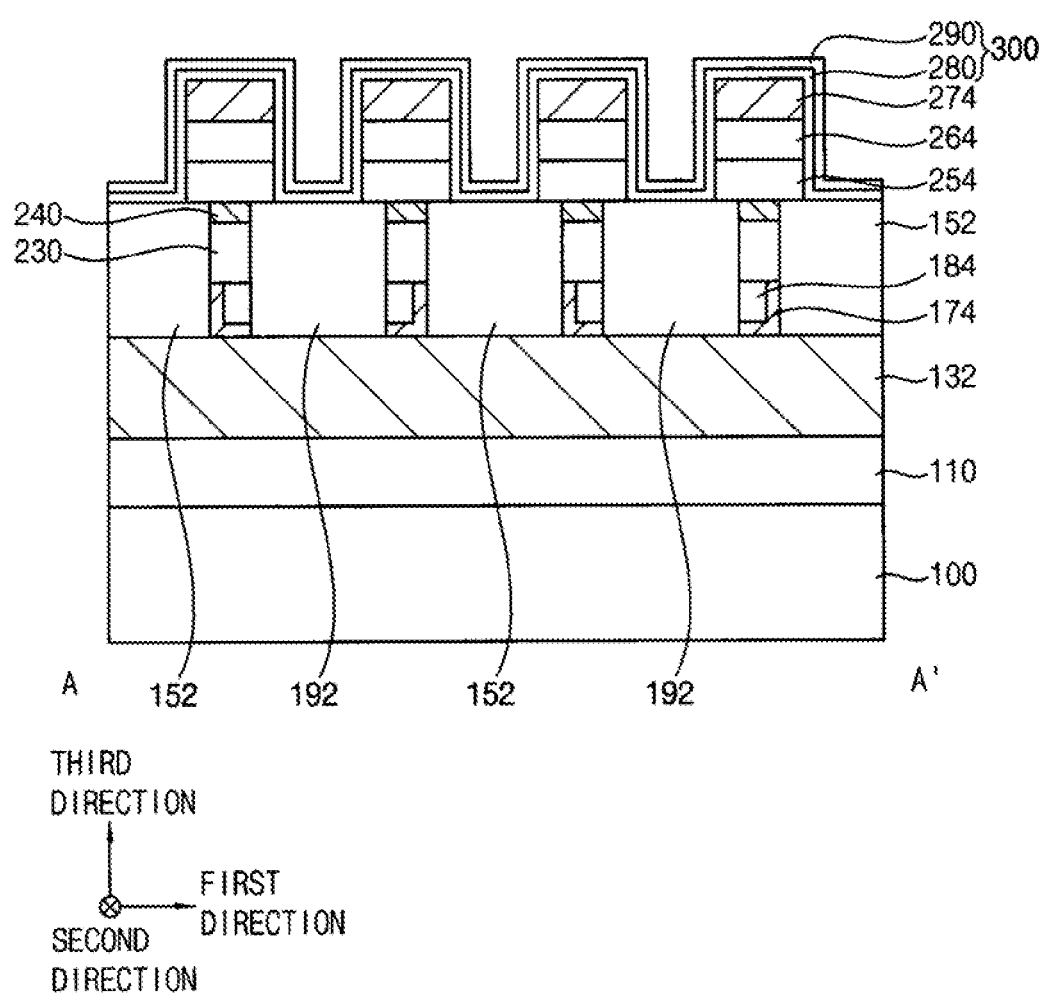

Referring to FIG. 22, a second capping layer 290 may be formed on the first capping layer 280.

In an example embodiment of the present inventive concept, the second capping layer 290 may be formed by a deposition process using a silicon (Si) source gas and a reaction gas. The deposition process may include, for example, an atomic layer deposition (ALD) process or a chemical vapor deposition (CVD) process. The silicon source gas may include, e.g., silane (SiH$_4$) gas, and the reaction gas may include, e.g., nitrogen (N$_2$), ammonia (NH$_3$), etc. Other silicon (Si) source gas such as, e.g., disilane (Si$_2$H$_6$), diiodosilane (SiH$_2$I$_2$), dichlorosilane (SiH$_2$Cl$_2$), etc. may also be used.

The second capping layer 290 may be formed using the reaction gas that may include nitrogen together with the silicon (Si) source gas, however, as the first selection pattern 254 including the OTS material is covered by the first capping layer 280, the first selection pattern 254 may not react with nitrogen during the deposition process, so that the composition of the first selection pattern 254 may not be changed. If the second capping layer 290 is formed to cover the first selection pattern 254 without the formation of the first capping layer 280, the reaction gas including nitrogen may nitridize the elements constituting the OTS material included in the first selection pattern 254 to form a nitride compound and thus to change the OTS material composition and the characteristics of the OTS material.

In an example embodiment of the present inventive concept, the second capping layer 290 may include, e.g., silicon nitride (Si$_3$N$_4$), silicon oxynitride (SiON), silicon carbonitride (SiCN), silicon boron nitride (SiBN), etc. Accordingly, the second capping layer 290 may effectively prevent moisture and residual chemicals from penetrating into the first selection pattern 254 from the outside. In addition, the second capping layer 290 may prevent oxidation of the OTS material included in the first selection pattern 254.

In an example embodiment of the present inventive concept, when the first capping layer 280 is formed of amorphous silicon (Si) and the second capping layer 290 is formed of silicon nitride (Si$_3$N$_4$), the first and second capping layers 280 and 290 may be formed by changing only from inert gas to the reaction gas in the same chamber during the deposition process. For example, the silicon (Si) source may be the same, but the inert gas such as, e.g., helium (He), argon (Ar), etc. used in forming the first capping layer 280 may be changed to the reaction gas such as, e.g., nitrogen (N$_2$), ammonia (NH$_3$), etc. to form the second capping layer 290.

The first and second capping layers 280 and 290 sequentially stacked on a sidewall and an upper surface of the second structure may form a first capping layer structure 300.

Figure 23:
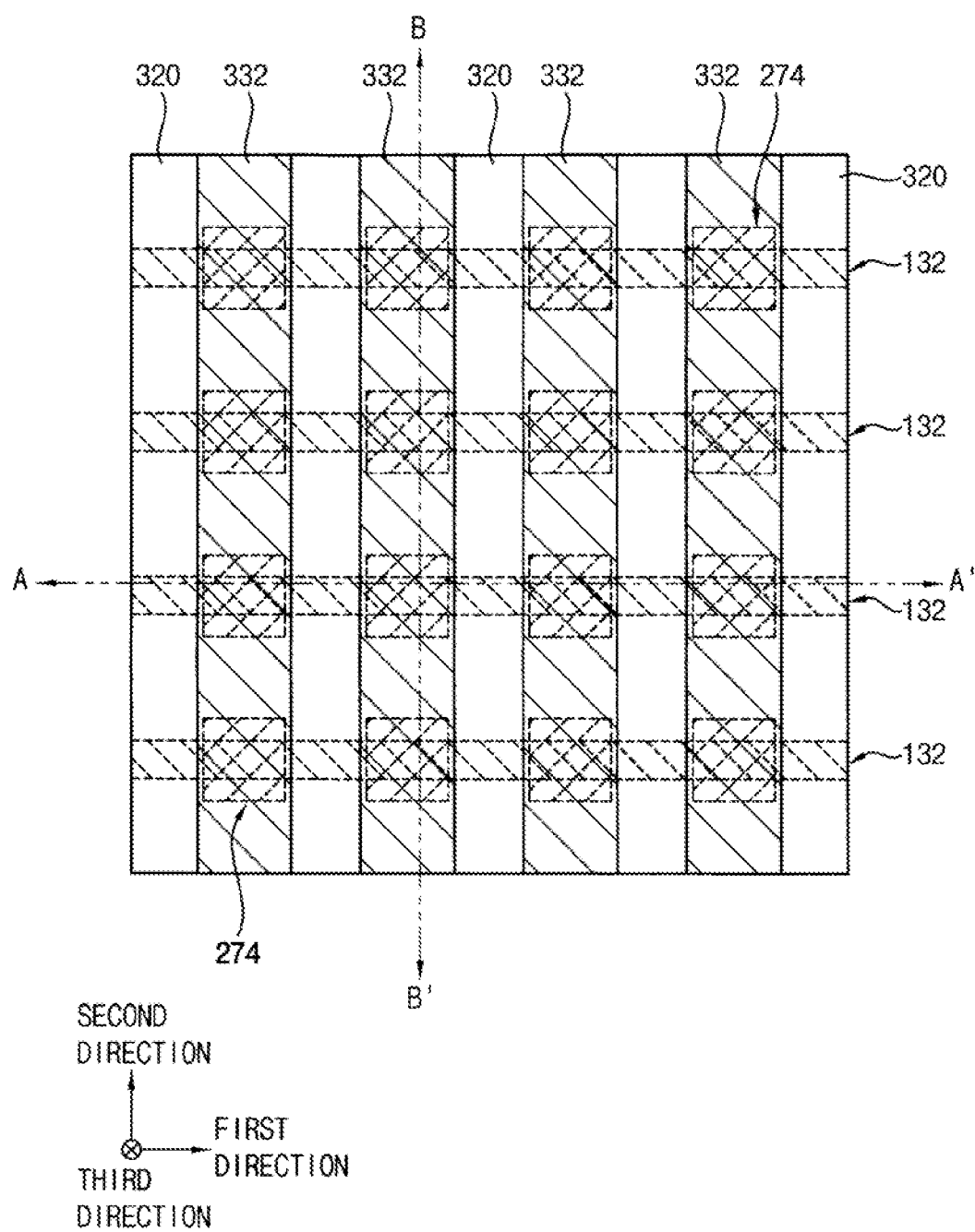

Referring to FIGS. 23 to 25, after forming a fifth insulating interlayer 310 on the first capping layer structure 300 to fill a space between the second structures, the fifth insulating interlayer 310 may be planarized until the upper surfaces of the second structures, that is, upper surfaces of the third electrodes 274 are exposed. The planarization process may be performed by, e.g., a chemical mechanical polishing (CMP) process and/or an etch back process.

When the planarization process is performed, portions of the first capping layer structures 300 on the upper surfaces of third electrodes 274 may also be removed, and thus a first capping structure 305 may be formed to cover the sidewalls of the second structures and upper surfaces of portions of the fourth insulating interlayer 220 and the second and third interlayer insulation patterns 152 and 192 between the second structures. The first capping structure 305 may include a first capping pattern 285 and a second capping pattern 295 sequentially stacked.

The fifth insulating interlayer 310 may include an oxide, e.g., silicon oxide (SiO$_2$).

A sixth insulating interlayer 320 may be formed on the second structures, the fifth insulating interlayer 310 and the first capping structure 305, and a second conductive line 332 extending through the sixth insulating interlayer 320 in the third direction to contact the upper surface of the second structure may be formed.

In an example embodiment of the present inventive concept, the second conductive line 332 may extend in the second direction to contact the upper surfaces of the third electrodes 274 in the second structures thereunder, and a plurality of second conductive lines 332 may be formed to be spaced apart from each other along the first direction. The plurality of second conductive lines may extend in parallel with each other in the second direction.

The second conductive line 332 may include a metal and/or a metal nitride. The metal may include, e.g., tungsten (W), platinum (Pt), copper (Cu), aluminum (Al), titanium (Ti), tantalum (Ta), etc., and the metal nitride may include, e.g., titanium nitride ($TiN_x$), tungsten nitride ($WN_x$), tantalum nitride ($TaN_x$), zirconium nitride ($ZrN_x$), etc.

The second conductive line 332 may have a single layer structure, or a multi-layered structure in which a plurality of layers may be stacked. In an example embodiment of the present inventive concept, the second conductive line 332 may serve as a bit line of the variable resistance memory device. Alternatively, the second conductive line 332 may serve as a word line. The sixth insulating interlayer 320 may include an oxide, e.g., silicon oxide ($SiO_2$).

By performing the processes described above, the fabrication of the variable resistance memory device may be completed.

As described above, the sidewall of the first selection pattern 254 including the OTS material may be covered by the first capping structure 305, and thus the oxidation of the first selection pattern 254 may be prevented.

In an example embodiment of the present inventive concept, the first capping structure 305 may be formed to cover a sidewall of the first variable resistance pattern 230 so as to prevent oxidation of the first variable resistance pattern 230, and to prevent moisture and residual chemicals from penetrating.

The first capping structure 305 may include the first capping pattern 285 and the second capping pattern 295 sequentially stacked, and the second capping pattern 295 may include a nitride, e.g., silicon nitride ($Si_3N_4$), so that the penetration of moisture or residual chemicals from outside may be prevented.

The first capping pattern 285 directly contacting the sidewall of the first selection pattern 254 may include, e.g., amorphous silicon (Si), and not include nitrogen (N). Also, the formation of the amorphous silicon layer may use only the silicon (Si) source gas and the inert gas so as not to react with the first selection pattern 254 during the deposition process. Accordingly, the first selection pattern 254 may not react with nitrogen to form a nitride, and the composition of the first selection pattern 254 may not be changed. The second capping layer 290 may be formed using the reaction gas that may include nitrogen (N) together with the silicon (Si) source gas. However, as the first selection pattern 254 including the OTS material is covered by the first capping layer 280 including amorphous silicon (Si), the first selection pattern 254 may not be nitridized by the reaction gas including nitrogen (N), and thus the OTS material included in the first selection pattern 254 may not be changed in its composition or characteristics.

Up to now, the method of manufacturing the variable resistance memory device including the first conductive lines 132 extending in the first direction, the second conductive lines 332 extending in the second direction, and the first memory units at areas at which the first and second conductive lines 132 and 332 are overlapped with each other in the third direction has been described. For example, the variable resistance memory device with a simple cross-point array structure has been described. However, the present inventive concept may not be limited thereto. For example, the variable resistance memory device according to an example embodiment of the present inventive concept may include more than two levels of conductive lines and more than one level of memory units.

Hereinafter, a method of manufacturing a variable resistance memory device including memory units at a plurality of levels will be described. For convenience of explanation, only the variable resistance memory device including first and second memory units at two levels, respectively, will be described, however, the present inventive concept may not be limited thereto.

Figure 26:
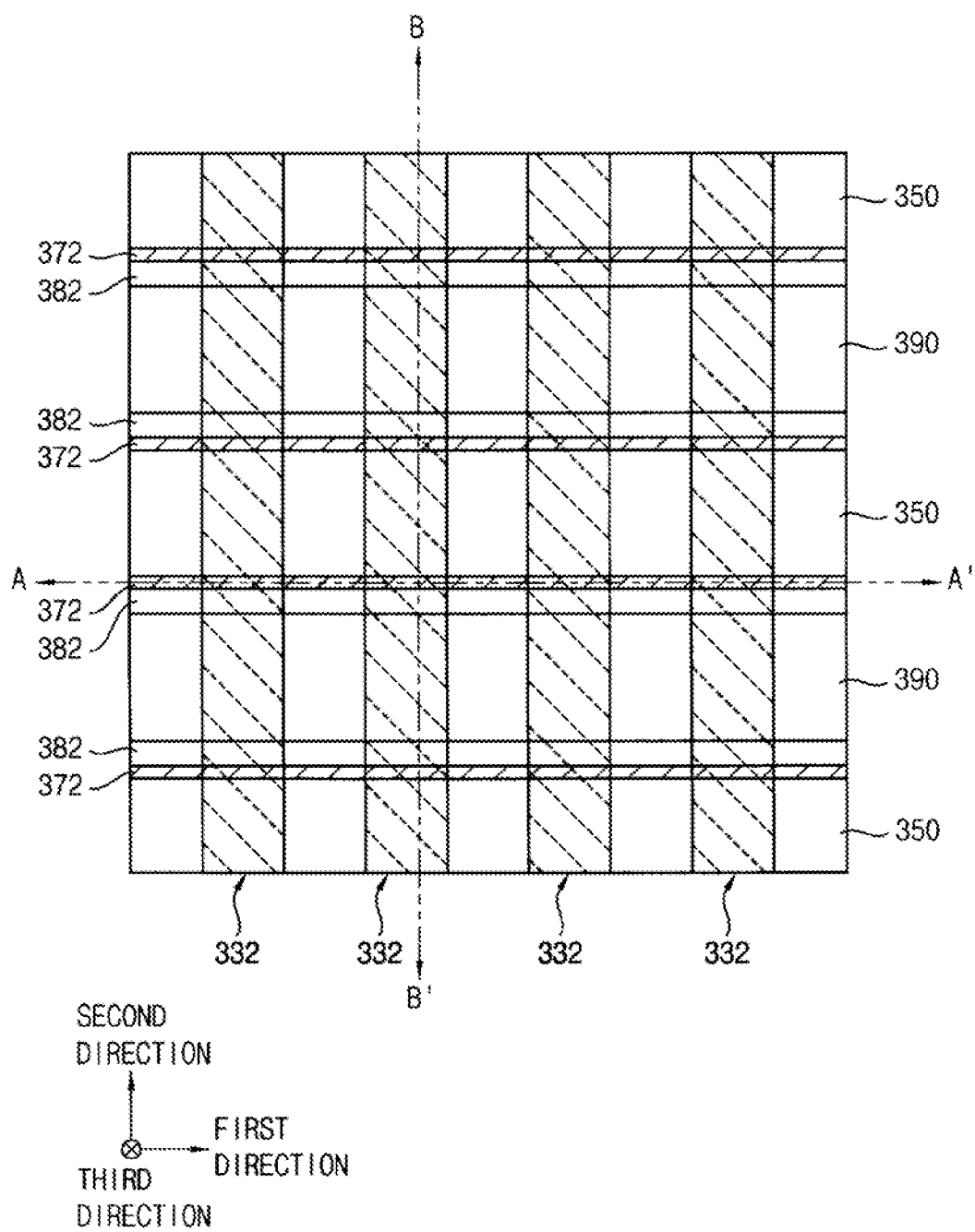
Figure 27:
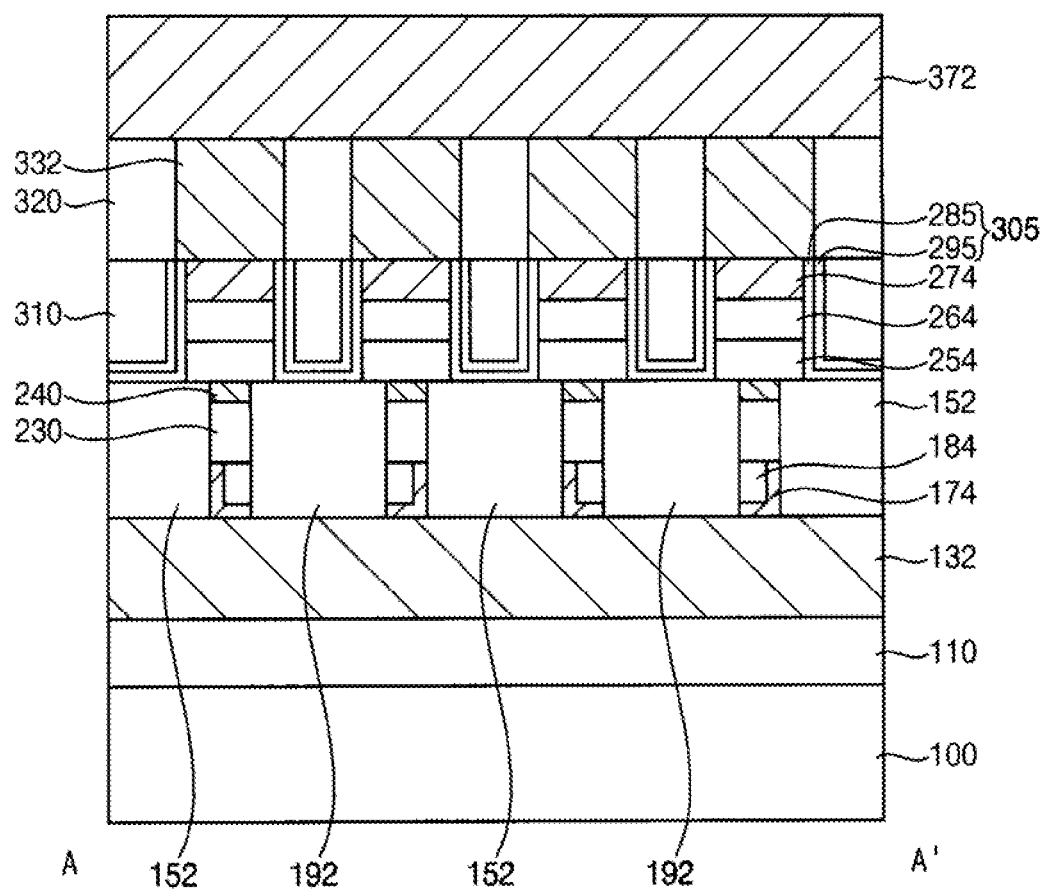
Figure 28:
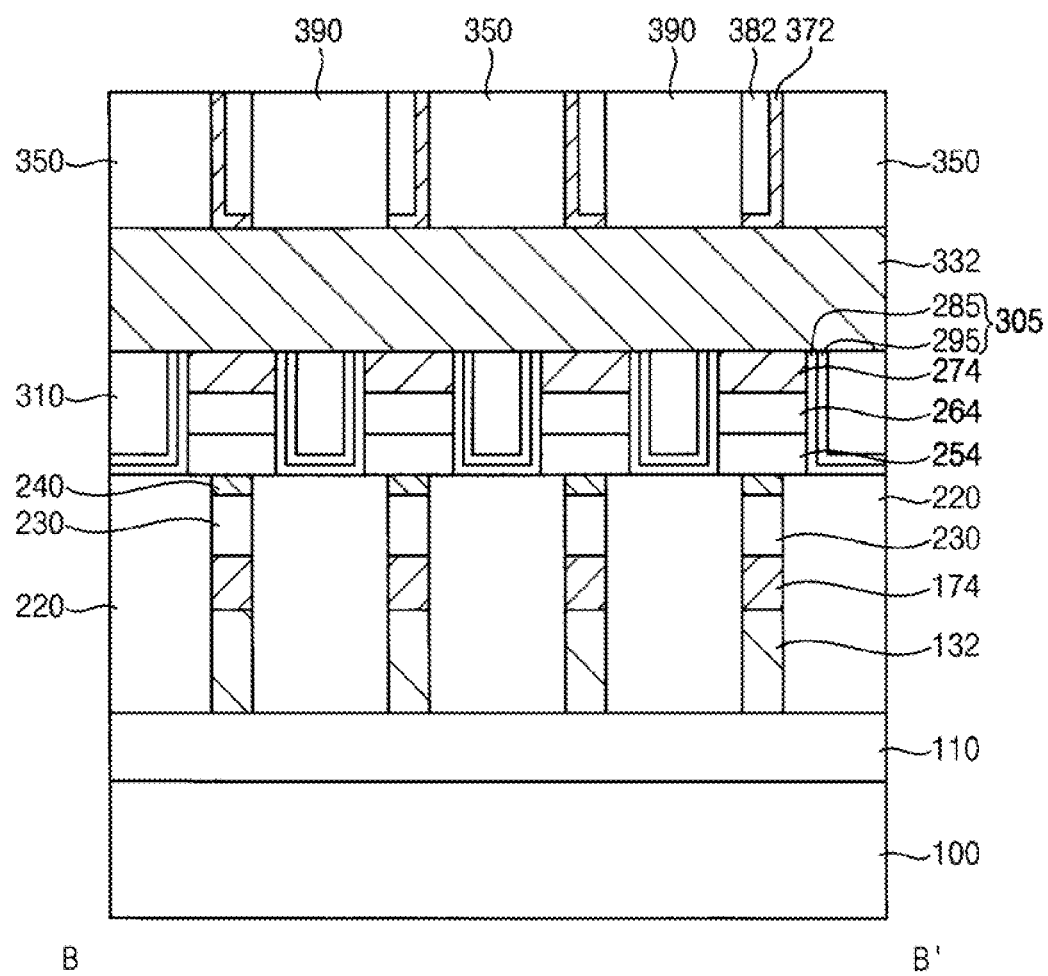

Referring to FIGS. 26 to 28, processes substantially the same as or similar to the processes described in FIGS. 3 to 7 may be performed over a variable resistance memory device fabricated with steps described above with reference to FIGS. 1-25. For example, the processes substantially the same as or similar to the processes described with reference to FIGS. 3 to 7 may be performed on a variable resistance memory device which already has the first memory units at one level fabricated.

A preliminary fourth electrode 372, a preliminary second spacer 382 and seventh and eighth insulating interlayers 350 and 390 may be formed on the sixth insulating interlayer 320 and the second conductive lines 332.

In an example embodiment of the present inventive concept, each of the preliminary fourth electrode 372 and the preliminary second spacer 382 may extend in the first direction, and a plurality of preliminary fourth electrodes 372 and a plurality of preliminary second spacers 382 may be formed along the second direction. For example, the plurality of preliminary fourth electrodes 372 and the plurality of preliminary second spacers 382 may extend in parallel with each other in the first direction and spaced apart from each other in the second direction.

Figure 29:
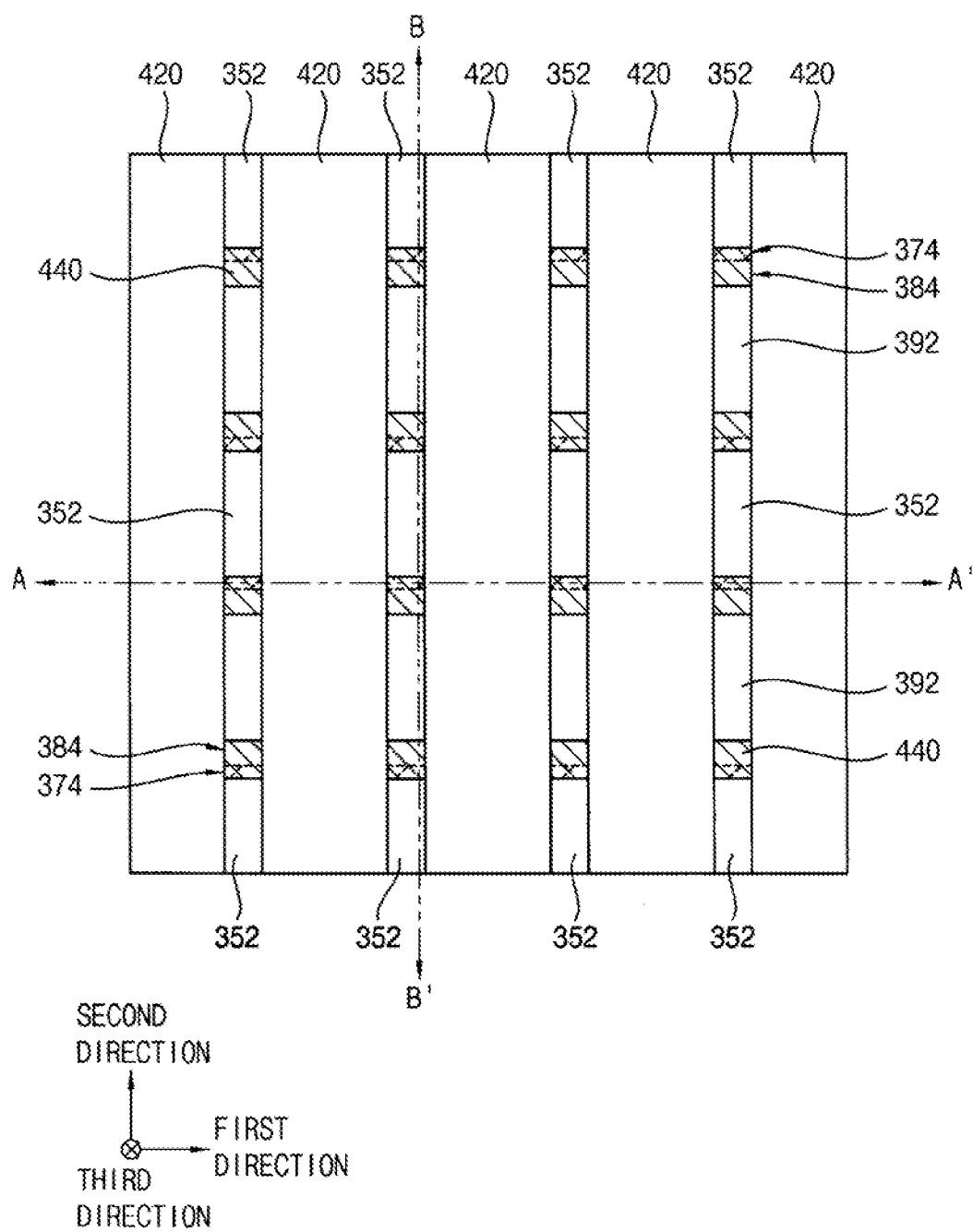

Referring to FIGS. 29 to 31, processes substantially the same as or similar to the processes described in FIGS. 8 to 16 may be performed.

A plurality of second memory units including a fourth electrode 374, a second variable resistance pattern 430 and a fifth electrode 440 sequentially stacked may be formed along each of the first and second directions. For example, the plurality of second memory units may be spaced apart from each other in the first direction and also spaced apart from each other in the second direction. In an example embodiment of the present inventive concept, the fourth electrode 374 may have an L-shaped cross-section taken along the second direction, the second spacer 384 may be formed on the fourth electrode 374, and an upper surface of the second spacer 384 together with an upper surface of the fourth electrode 374 may contact a lower surface of the second variable resistance pattern 430.

In an example embodiment of the present inventive concept, the second memory units may contact an upper surface of the second conductive line 332.

Seventh and eighth interlayer insulation patterns 352 and 392 covering sidewalls of the second memory unit and the second spacer 384 in the second direction may be formed on the second conductive line 332 and the sixth insulating interlayer 320, and a ninth insulating interlayer 420 covering a sidewall of a third structure including the second memory unit, the second spacer 384, and the seventh and eighth interlayer insulation patterns 352 and 392 may be formed to extend in the second direction.

Figure 32:
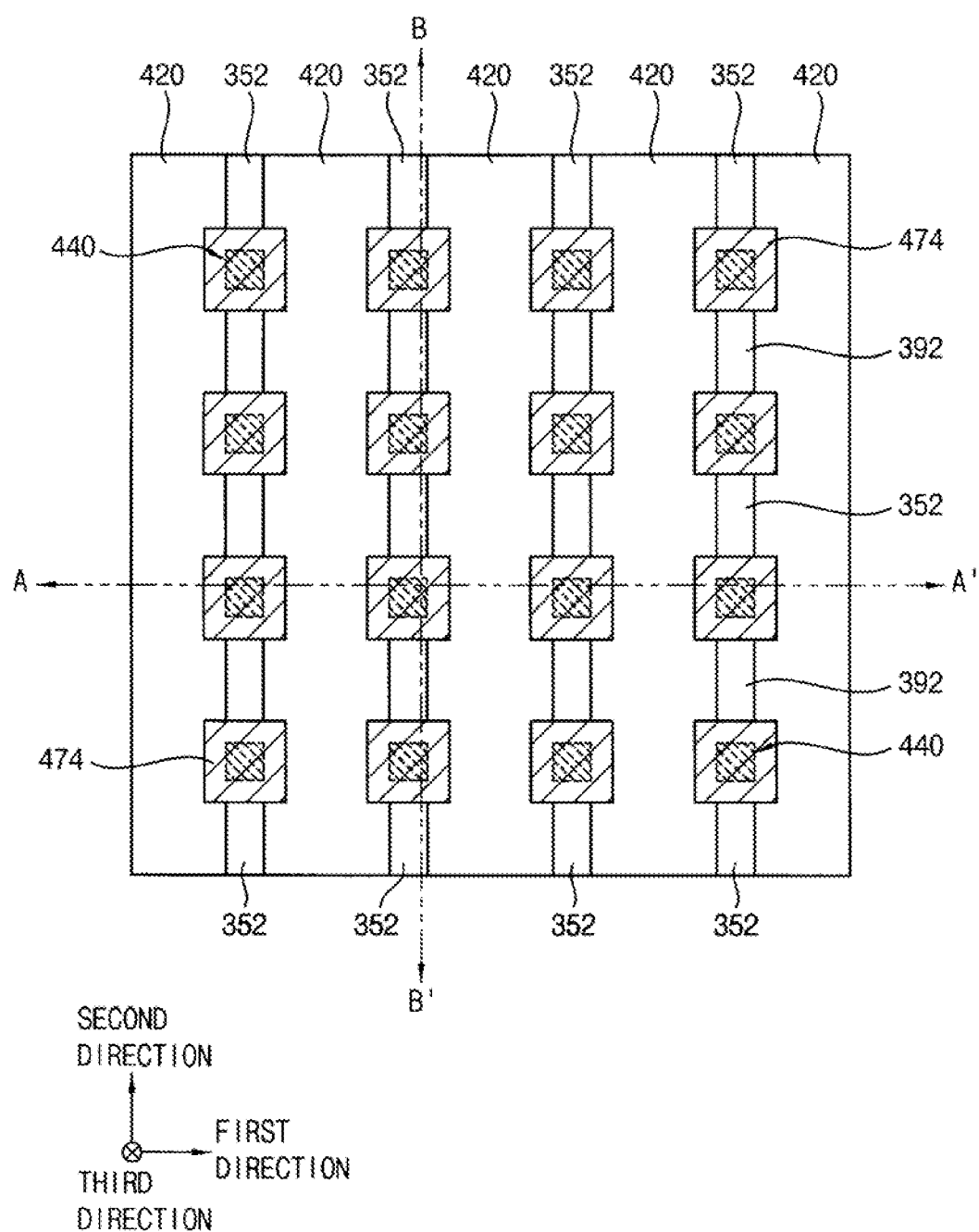
Figure 34:
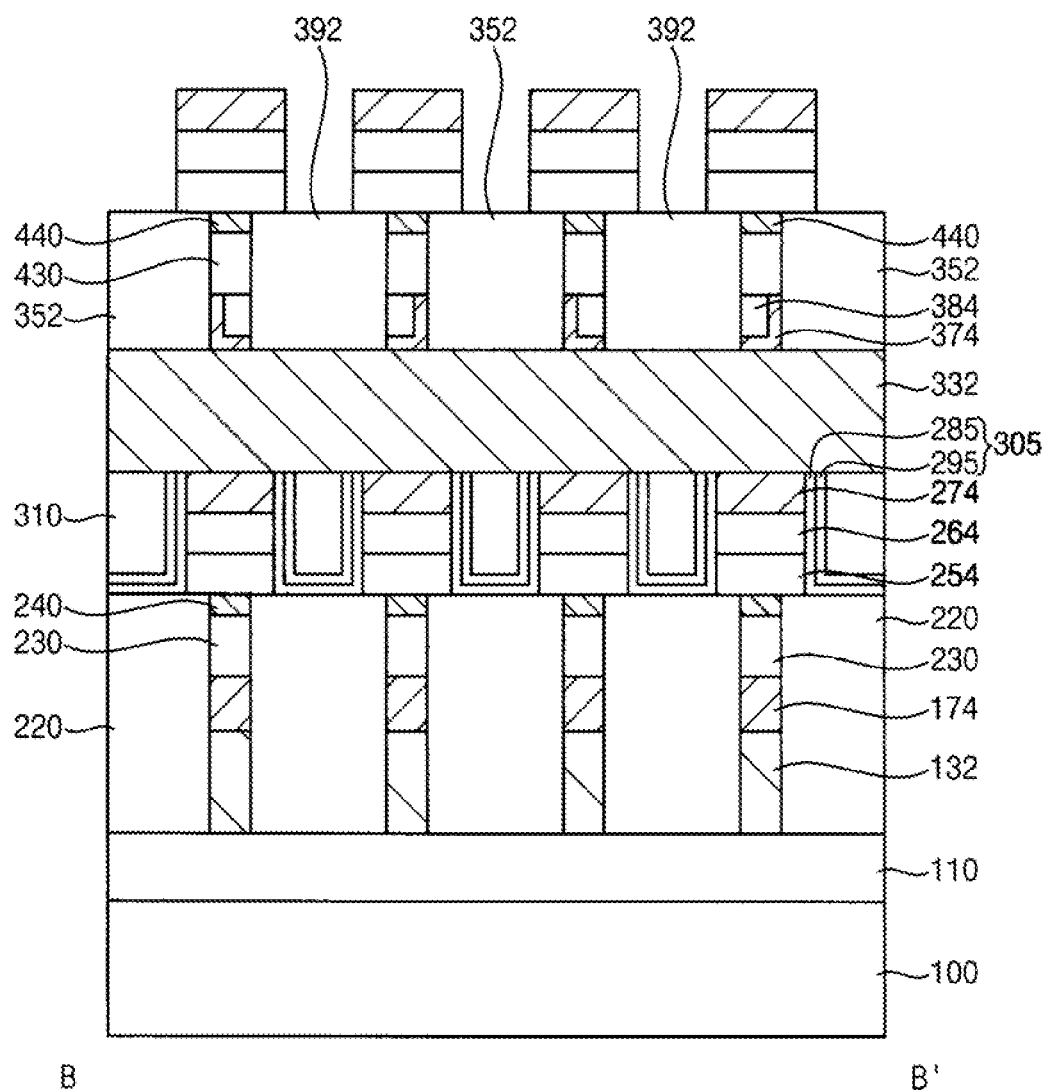

Referring to FIGS. 32 to 34, processes substantially the same as or similar to the processes described in FIGS. 17 to 20 may be performed.

A fourth structure including a second selection pattern 454, a second buffer pattern 464 and a sixth electrode 474 sequentially stacked on the fifth electrode 440, the ninth insulating interlayer 420, and the seventh and eighth interlayer insulation patterns 352 and 392 may be formed. For example, the second selection pattern 454 of the fourth structure may directly contact the fifth electrode 440 of the second memory unit.

In an example embodiment of the present inventive concept, a plurality of fourth structures may be formed along the second direction to overlap each of the second conductive lines 332 extending in the second direction, and thus may be formed to be spaced apart from each other in each of the first and second directions. Also, the plurality of fourth structures may be formed to overlap the plurality of second memory units, respectively.

Referring to FIG. 35, processes substantially the same as or similar to the processes described in FIGS. 21 and 22 may be performed.

A second capping layer structure 500 covering a sidewall and an upper surface of the fourth structure may be formed on the ninth insulating interlayer 420 and the seventh and eighth interlayer insulation patterns 352 and 392, and the second capping layer structure 500 may include third and fourth capping layers 480 and 490 sequentially stacked. In an example embodiment of the present inventive concept, the third capping layer 480 may include, e.g., amorphous silicon (Si), and the fourth capping layer 490 may include a nitride, e.g., silicon nitride ($Si_3N_4$), silicon oxynitride (SiON), silicon carbonitride (SiCN), silicon boron nitride (SiBN), etc.

Figure 36:
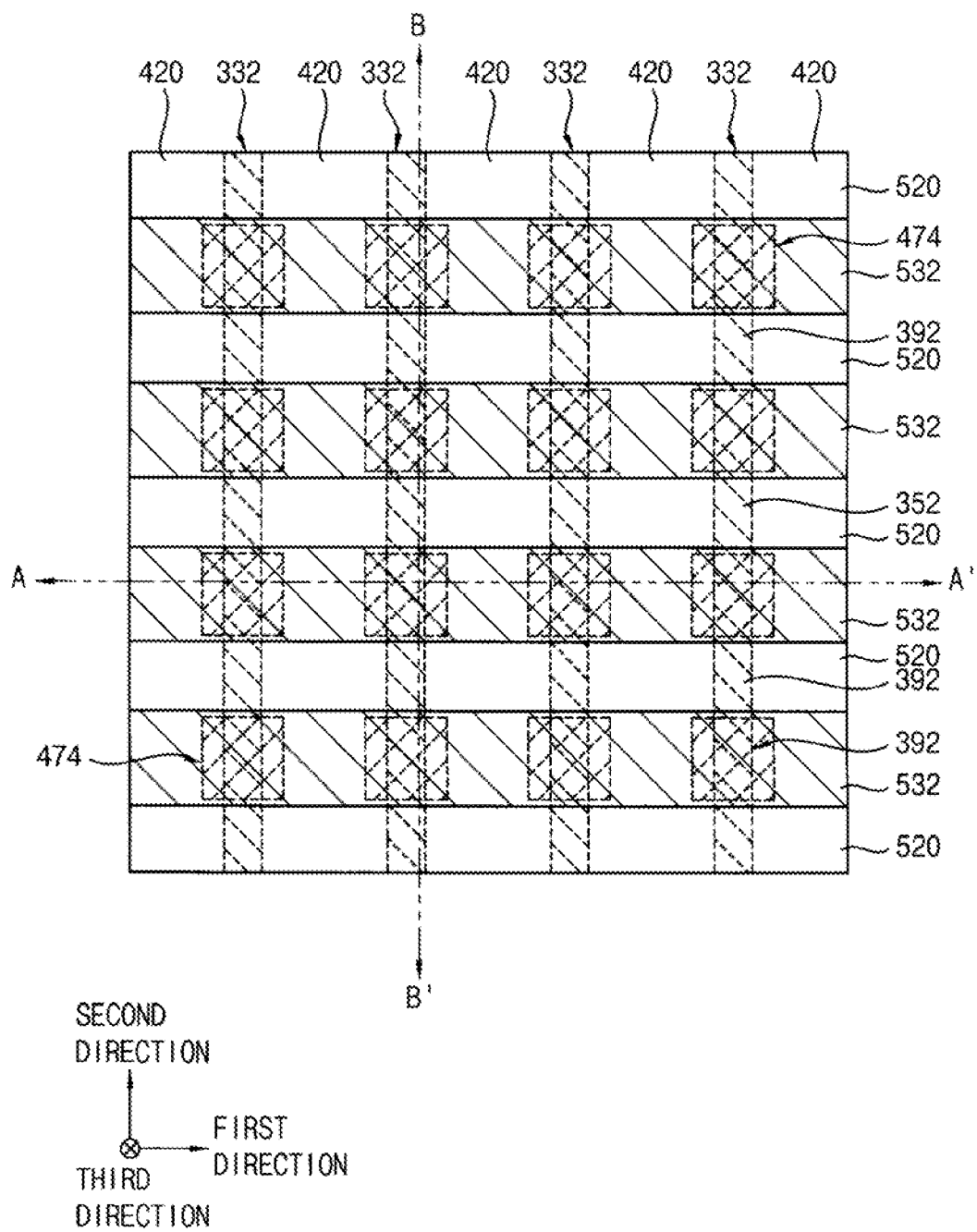
Figure 37:
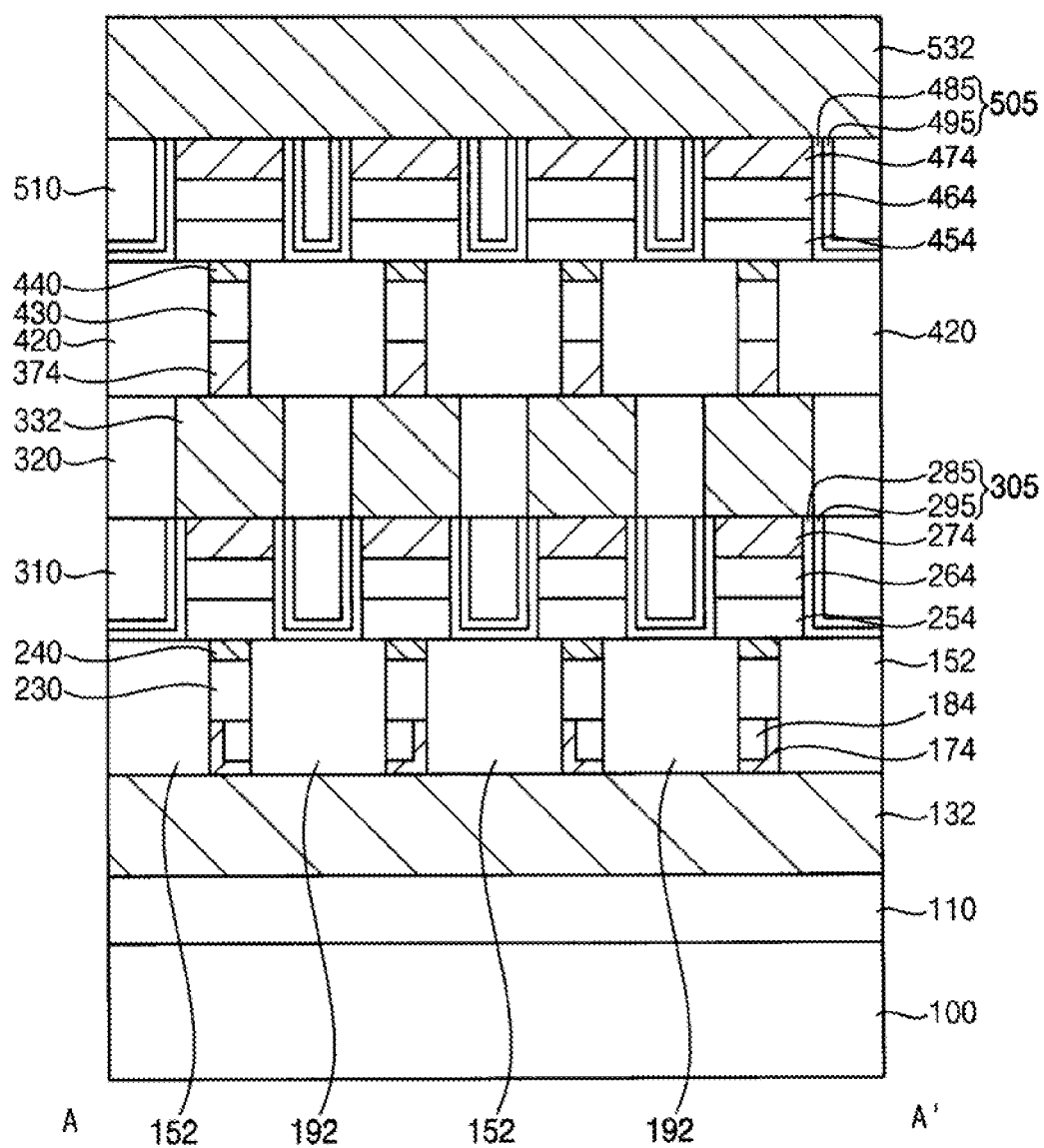

Referring to FIGS. 36 to 38, processes substantially the same as or similar to the processes described in FIGS. 23 to 25 may be performed.

After forming a tenth insulating interlayer 510 filling a space between the fourth structures on the second capping layer structure 500, the tenth insulating interlayer 510 may be planarized until upper surfaces of the fourth structures, that is, upper surfaces of the sixth electrodes 474 are exposed. The planarization process may be performed by, e.g., a chemical mechanical polishing (CMP) process and/or an etch back process.

By the planarization process, a second capping structure 505 may be formed to cover the sidewalls of the fourth structures and upper surfaces of portions of the ninth insulating interlayer 420 and the seventh and eighth interlayer insulation patterns 352 and 392 between the fourth structures. The second capping structure 505 may include a third capping pattern 485 and a fourth capping pattern 495 sequentially stacked.

As described above, the sidewall of the second selection pattern 454 including the OTS material may be covered by the second capping structure 505, and thus the oxidation of the second selection pattern 454 may be prevented. The third capping pattern 485 directly contacting the sidewall of the second selection pattern 454 may include, e.g., amorphous silicon (Si), and may not include nitrogen (N). Accordingly, the second selection pattern 454 may not react with nitrogen (N) to form a nitride, and the composition of the second selection pattern 454 may not be changed. The fourth capping pattern 495 may include a nitride, e.g., silicon nitride ($Si_3N_4$), so that the penetration of moisture or residual chemicals from outside may be prevented.

In an example embodiment of the present inventive concept, the second capping structure 505 may be formed to cover a sidewall of the second variable resistance pattern 430 so as to prevent oxidation of the second variable resistance pattern 430, and to prevent moisture and residual chemicals from penetrating.

An eleventh insulating interlayer 520 may be formed on the fourth structures, the tenth insulating interlayer 510 and the second capping structure 505, and a third conductive line 532 extending through the eleventh insulating interlayer 520 in the third direction to contact the upper surface of the fourth structure may be formed.

In an example embodiment of the present inventive concept, the third conductive line 532 may extend in the first direction to contact the upper surfaces of the sixth electrodes 474 in the fourth structures thereunder, and a plurality of third conductive lines 532 may be formed to be spaced apart from each other along the second direction. For example, the plurality of third conductive lines 532 may extend in parallel with each other in the first direction.

The third conductive line 532 may serve as a word line of the variable resistance memory device. Alternatively, the third conductive line 532 may serve as a bit line.

By performing the processes described above, the fabrication of the variable resistance memory device including the first and second memory units stacked in the third direction may be completed. Thus, the variable resistance memory device may be formed to have the first and second memory units at two levels, respectively, however, the present inventive concept may not be limited thereto. For example, by repeating the process steps with reference to FIGS. 26-38 described above one or more times, third memory units or more higher number memory units may be formed at three or more levels.

FIG. 39 is a cross-sectional view illustrating a variable resistance memory device in accordance with an example embodiment of the present inventive concept. FIG. 39 is a cross-sectional view taken along line B-B' of FIG. 23. This variable resistance memory device is substantially the same as or similar to the variable resistance memory device described in FIGS. 23 to 25, except for the shape of the second structure. Accordingly, like reference numerals refer to like elements, and detailed descriptions thereon are omitted herein.

Referring to FIG. 39, the second structure including the first selection pattern 254, the first buffer pattern 264 and the third electrode 274 sequentially stacked may extend in the second direction, and a plurality of second structures may be formed along the first direction, instead of being formed along each of the first and second directions. For example, the second structure may have a line shape instead of an island shape in a plan view.

As the second structure extends in the second direction, the first capping structure 305 may be formed to cover both sidewalls in the first direction of the second structure. The second conductive line 332 may be formed on each of the second structures.

Figure 41:
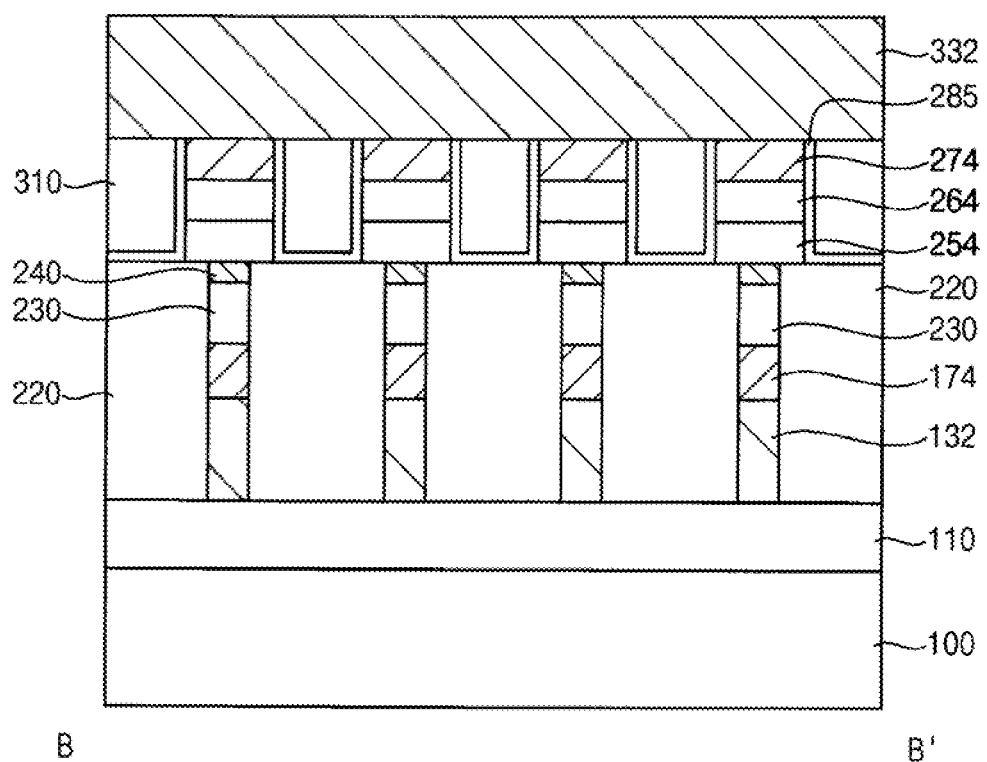

FIGS. 40 and 41 are cross-sectional views illustrating a variable resistance memory device in accordance with an example embodiment of the present inventive concept. FIG. 40 is a cross-sectional view taken along line A-A' of FIG. 23, and FIG. 41 is a cross-sectional view taken along line B-B' of FIG. 23.

This variable resistance memory device described with reference to FIGS. 40 and 41 is substantially the same as or similar to the variable resistance memory device described in FIGS. 23 to 25, except for the first capping structure 305 and the fifth insulating interlayer 310. Accordingly, like reference numerals refer to like elements, and detailed descriptions thereon are omitted herein.

Referring to FIGS. 40 and 41, the first capping structure 305 may include only the first capping pattern 285, instead of including the first and second capping patterns 285 and 295 sequentially stacked.

The second structure including the first selection pattern 254 may be covered by the first capping pattern 285, so that an oxidation of the second structure may be prevented. However, since the second capping pattern 295 including a nitride that may effectively prevent moisture and residual chemicals from penetration is not formed, the fifth insulating interlayer 310 may include a nitride instead of an oxide. That is, the fifth insulating interlayer 310 may serve as the role of the second capping pattern 295.

In an example embodiment of the present inventive concept, the first capping pattern 285 may include, e.g., amorphous silicon (Si), and the fifth insulating interlayer 310 may include, e.g., silicon nitride ($Si_3N_4$), silicon oxynitride (SiON), silicon carbonitride (SiCN), silicon boron nitride (SiBN), etc.

Figure 42:
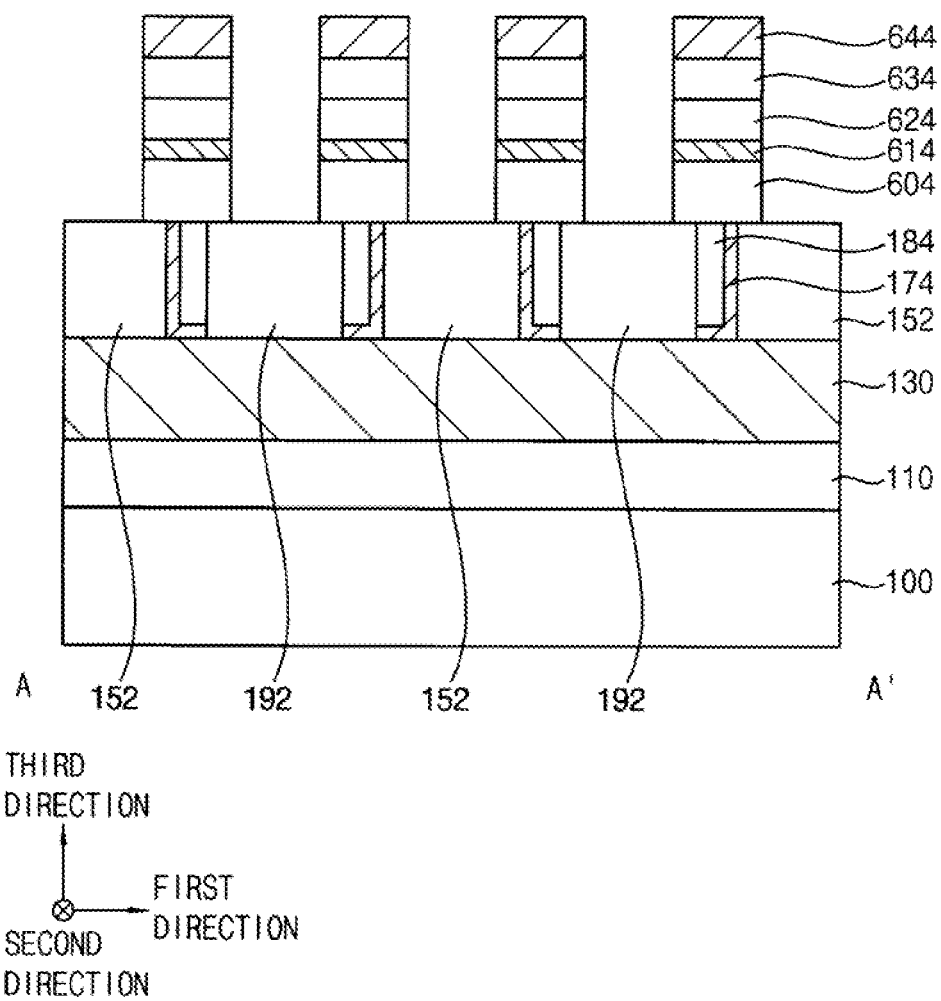
Figure 43:
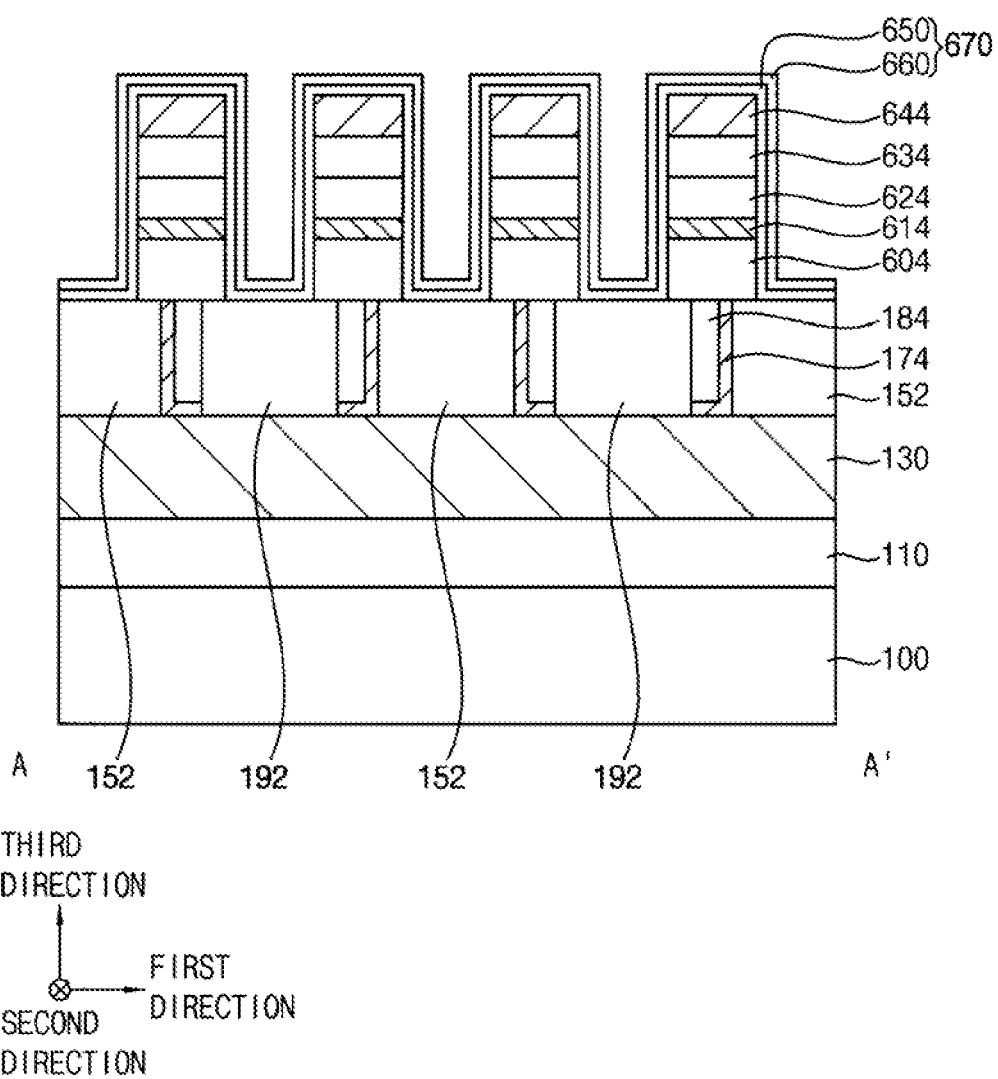

FIGS. 42 to 45 are cross-sectional views illustrating a method of manufacturing a variable resistance memory device in accordance with an example embodiment of the present inventive concept. FIGS. 42 to 44 are cross-sectional views each taken along line A-A' of a corresponding plan view, respectively, and FIG. 45 is a cross-sectional view taken along line B-B' of a corresponding plan view.

This method of manufacturing the variable resistance memory device includes processes substantially the same as or similar to the processes used in the method of manufacturing the variable resistance memory device described in FIGS. 1 to 25. Accordingly, like reference numerals refer to like elements, and detailed descriptions thereon are omitted herein.

Referring to FIG. 42, processes substantially the same as or similar to the processes described in FIGS. 1 to 14 may be performed. However, the processes of removing the upper portions of the first electrode 174 and the first spacer 184 to form the first recess 225, and forming the first variable resistance pattern 230 filling the first recess 225 may not be performed.

By sequentially stacking and patterning a third variable resistance layer, a seventh electrode layer, a third selection layer, a third buffer layer and an eighth electrode layer on the first electrodes 174, the first spacers 184, the second and third interlayer insulation patterns 152 and 192, and the fourth insulating interlayer 220, a plurality of fifth structures may be formed to be spaced apart from each other along each of the first and second directions. Each of the fifth structures may include a third variable resistance pattern 604, a seventh electrode 614, a third selection pattern 624, a third buffer pattern 634 and an eighth electrode 644 sequentially stacked.

Referring to FIG. 43, processes substantially the same as or similar to the processes described in FIGS. 21 and 22 may be performed to form a third capping layer structure 670 covering sidewalls and upper surfaces of the fifth structures.

The third capping layer structure 670 may include fifth and sixth capping layers 650 and 660 sequentially stacked, the fifth capping layer 650 may include, e.g., amorphous silicon (Si), and the sixth capping layer 660 may include, e.g., a nitride.

The third capping layer structure 670 may cover sidewalls of both of the third variable resistance pattern 604 and the third selection pattern 624.

In an example embodiment of the present inventive concept, the third variable resistance pattern 604 may include germanium antimony telluride (GST) material, and the third selection pattern 624 may include an Ovonic threshold switching (OTS) material. Since the GST material, OTS material, etc. are primarily covered by the amorphous silicon (Si) layer (e.g., the fifth capping layer 650), they may not be changed by the further formed nitride layer (e.g., the sixth capping layer 660), and may be protected by the nitride layer (e.g., the sixth capping layer 660) by preventing the penetration of moisture and residual chemicals into the third variable resistance pattern 604 and the third selection pattern 624.

Referring to FIGS. 44 and 45, processes substantially the same as or similar to the processes described in FIGS. 23 to 25 may be performed to complete the fabrication of the variable resistance memory device.

A third capping structure 675 may be formed to cover the sidewalls of each of the fifth structures, and the third capping structure 675 may include fifth and sixth capping patterns 655 and 665 sequentially stacked.

A twelfth insulating interlayer 680 may be formed on the third capping structure 675 to cover a space between the fifth structures, and a thirteenth insulating interlayer 690 may be formed on the fifth structures, the third capping structure 675 and the twelfth insulating interlayer 680. A fourth conductive line 702 extending through the thirteenth insulating interlayer 690 in the third direction to contact the upper surface of the fifth structure may be formed. A plurality of fourth conductive lines 702 may extend in parallel with each other in the second direction and may be spaced apart from each other in the first direction.

The above variable resistance memory device may be applied to PRAM devices, ReRAM devices, MRAM devices, etc.

As described above, although the present inventive concept has been described with reference to example embodiments, those skilled in the art will readily appreciate that many modifications are possible in the example embodiments without departing from the spirit and scope of the present inventive concept as defined by the appended claims.

What is claimed is:
1. A variable resistance memory device, comprising:
   a memory unit including:
      a first electrode disposed on a substrate;
      a variable resistance pattern disposed on the first electrode; and
      a second electrode disposed on the variable resistance pattern;
   a selection pattern disposed on the memory unit; and
   a capping structure covering a sidewall of the selection pattern,
   wherein the capping structure includes a first capping pattern and a second capping pattern sequentially stacked on at least one sidewall of the selection pattern, and
   wherein the first capping pattern is amorphous silicon pattern which is formed using only a silicon source gas and an inert gas, and the second capping pattern includes a nitride.

2. The variable resistance memory device of claim 1, wherein the second capping pattern comprises silicon nitride, silicon oxynitride, silicon carbonitride or silicon boron nitride.

3. The variable resistance memory device of claim 1, wherein the capping structure covers a sidewall of the variable resistance pattern.

4. The variable resistance memory device of claim 1, further comprising:
a buffer pattern and a third electrode sequentially stacked on the selection pattern.

5. The variable resistance memory device of claim 4, wherein the capping structure covers sidewalls of the buffer pattern and the third electrode.

6. The variable resistance memory device of claim 1, wherein the selection pattern includes an OTS material comprising germanium (Ge), silicon (Si), arsenic (As) and tellurium (Te).

7. The variable resistance memory device of claim 1, wherein the selection pattern comprises at least one of AsTeGeSiIn, GeTe, SnTe, GeSe, SnSe, AsTeGeSiSbS, AsTeGeSiInP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P_1$, $As_{10}Te_{21}S_2Ge_{15}Se_{50}Sb_2$, $Si_5Te_{34}As_{28}Ge_{11}S_{21}Se_1$, AsTeGe-SiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe and $Ge_xSe_{1-x}$.

8. The variable resistance memory device of claim 1, wherein the variable resistance pattern includes a phase change material.

9. The variable resistance memory device of claim 8, wherein the variable resistance pattern includes a super lattice comprising $Ge_2Sb_2Te_5$ (GST), GeTe and SbTe, InSbTe (IST), or BiSbTe (BST).

10. The variable resistance memory device of claim 1, further comprising:
a first conductive line extending in a first direction substantially parallel to an upper surface of the substrate; and
a second conductive line on the first conductive line extending in a second direction substantially parallel to the upper surface of the substrate and intersecting the first direction,
wherein the memory unit and the selection pattern are formed at each area at which the first and second conductive lines are overlapped with each other in a third direction substantially perpendicular to the upper surface of the substrate between the first and second conductive lines, and
wherein the memory unit receives electrical signals from the first conductive line, saves the electrical signals by magnetization, and sends the electrical signals to the second conductive line.

11. A variable resistance memory device, comprising:
a plurality of memory units, each of the memory units including:
a first electrode disposed on a substrate;
a variable resistance pattern disposed on the first electrode; and
a second electrode disposed on the variable resistance pattern;
a plurality of selection patterns disposed on the memory units; and
a plurality of capping structures covering sidewalls of the selection patterns,
wherein each of the capping structures includes a first capping pattern and a second capping pattern sequentially stacked on at least one sidewall of each of the selection patterns, and
wherein the first capping pattern is amorphous silicon pattern, and the second capping pattern includes a nitride.

12. The variable resistance memory device of claim 11, wherein the plurality of memory units and the plurality of selection patterns are formed along each of first and second directions that are substantially parallel to an upper surface of the substrate and intersecting with each other, and
wherein each of the capping structures covers both sidewalls in each of the first and second directions of each of the plurality of selection patterns.

13. The variable resistance memory device of claim 11, wherein each of the selection patterns extends in a first direction substantially parallel to an upper surface of the substrate, with the each of the selection patterns being formed along a second direction substantially parallel to the upper surface of the substrate and intersecting the first direction, and
wherein each of the capping structures covers each of both sidewalls in the second direction of each of the plurality of selection patterns.

14. The variable resistance memory device of claim 11, wherein a plurality of variable resistance patterns included in the plurality of memory units are formed along each of first and second directions that are substantially parallel to an upper surface of the substrate and intersecting with each other, and
wherein each of the capping structures covers both sidewalls in each of the first and second directions of each of the plurality of variable resistance patterns.

15. The variable resistance memory device of claim 11, further comprising:
a plurality of first conductive lines spaced apart from each other in a second direction substantially parallel to an upper surface of the substrate, each of the first conductive lines extending in a first direction substantially parallel to the upper surface of the substrate and intersecting the second direction; and
a plurality of second conductive lines spaced apart from each other in the first direction on the first conductive lines, each of the second conductive lines extending in the second direction,
wherein the memory units and the selection patterns are formed at each area at which the first and second conductive lines are overlapped with each other in a third direction substantially perpendicular to the upper surface of the substrate between the first and second conductive lines, and
wherein the memory units receive electrical signals from the first conductive lines, save the electrical signals by magnetization, and send the electrical signals to the second conductive lines.

16. A variable resistance memory device, comprising:
a memory unit including a variable resistance pattern disposed on a substrate;
a selection pattern disposed on the memory unit; and
a capping structure covering sidewalls of the variable resistance pattern and the selection pattern,
wherein the capping structure includes a first capping pattern and a second capping pattern sequentially stacked, and wherein the first capping pattern includes amorphous silicon, and the second capping pattern includes a nitride.

17. The variable resistance memory device of claim 16, wherein the first capping pattern and the second capping pattern are sequentially stacked in a horizontal direction substantially parallel to an upper surface of the substrate.

18. The variable resistance memory device of claim 16, wherein the memory unit further comprises:
- a first electrode disposed under the variable resistance pattern; and
- a second electrode disposed on the variable resistance pattern, and the variable resistance memory device further comprises:
- a buffer pattern disposed on the selection pattern; and
- a third electrode disposed on the buffer pattern.

19. The variable resistance memory device of claim 18, wherein the capping structure covers sidewalls of the buffer pattern and the third electrode.

* * * * *